(12) United States Patent
Kawaguchi

(10) Patent No.: US 9,094,623 B2
(45) Date of Patent: Jul. 28, 2015

(54) SOLID STATE IMAGING DEVICE, METHOD OF CONTROLLING SOLID STATE IMAGING DEVICE, AND PROGRAM FOR CONTROLLING SOLID STATE IMAGING DEVICE

(75) Inventor: Takashi Kawaguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 317 days.

(21) Appl. No.: 13/598,986

(22) Filed: Aug. 30, 2012

(65) Prior Publication Data

US 2013/0075588 A1 Mar. 28, 2013

(30) Foreign Application Priority Data

Sep. 22, 2011 (JP) ................. 2011-207368

(51) Int. Cl.
*H01L 27/00* (2006.01)
*H04N 5/347* (2011.01)
*H04N 5/374* (2011.01)
*H04N 5/3745* (2011.01)
*H04N 5/378* (2011.01)
*H04N 9/04* (2006.01)

(52) U.S. Cl.
CPC ............... *H04N 5/347* (2013.01); *H04N 5/374* (2013.01); *H04N 5/378* (2013.01); *H04N 5/3745* (2013.01); *H04N 9/045* (2013.01)

(58) Field of Classification Search
CPC ............ H01L 27/146; H01L 27/14609; H01L 27/14612; H04N 3/14; H04N 5/335; H04N 5/343; H04N 5/347

USPC ................. 250/208.1, 214.1, 214 R, 214 DC, 250/214 LS; 348/273, 294, 302, 308, 320, 348/322
See application file for complete search history.

(56) References Cited

U.S. PATENT DOCUMENTS

2006/0262205 A1* 11/2006 Lim ............................... 348/241
2011/0025900 A1* 2/2011 Kondo ........................... 348/308

FOREIGN PATENT DOCUMENTS

| JP | 2006-033454 | 2/2006 |
|----|-------------|--------|
| JP | 2010-136226 | 6/2010 |

* cited by examiner

*Primary Examiner* — Kevin Pyo
(74) *Attorney, Agent, or Firm* — Wolf, Greenfield & Sacks, P.C.

(57) ABSTRACT

A solid state imaging device includes: a pixel array unit that has a plurality of pixels 2-dimensionally arranged in a matrix and a plurality of signal lines arranged along a column direction; A/D conversion units that are provided corresponding to the respective signal lines and convert an analog signal output from a pixel through the signal line into a digital signal; and a switching unit that switches or converts the analog signal output through each signal line into a digital signal using any of an A/D conversion unit provided corresponding to the signal line through which the analog signal is transmitted, and an A/D conversion unit provided corresponding to a signal line other than the signal line through which the analog signal is transmitted.

8 Claims, 19 Drawing Sheets

| SWa11 | SWa12 | SWa21 | SWa22 |
|-------|-------|-------|-------|
| ON    | OFF   | OFF   | ON    |
| OFF   | ON    | ON    | OFF   |

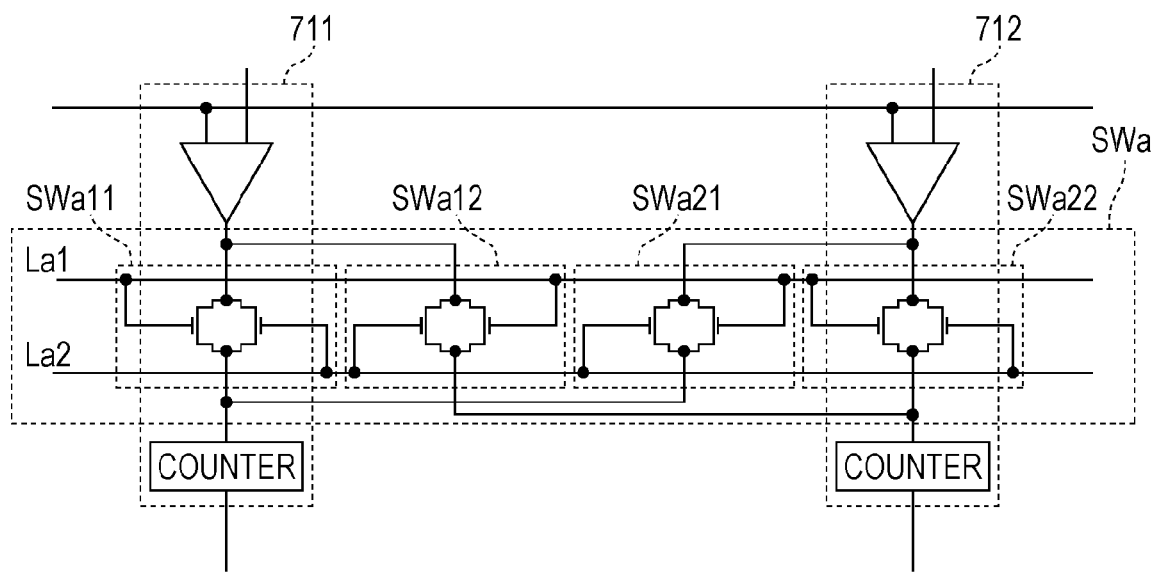

| SWb11 | SWb12 | SWb22 | SWb23 |
|-------|-------|-------|-------|
| ON    | OFF   | ON    | OFF   |
| OFF   | ON    | OFF   | ON    |

| Lb1 (XCROSS) | Lb2 (CROSS) | SWb11 | SWb12 | SWb22 | SWb23 |
|---|---|---|---|---|---|
| HIGHT | LOW | ON | OFF | ON | OFF |
| LOW | HIGHT | OFF | ON | OFF | ON |

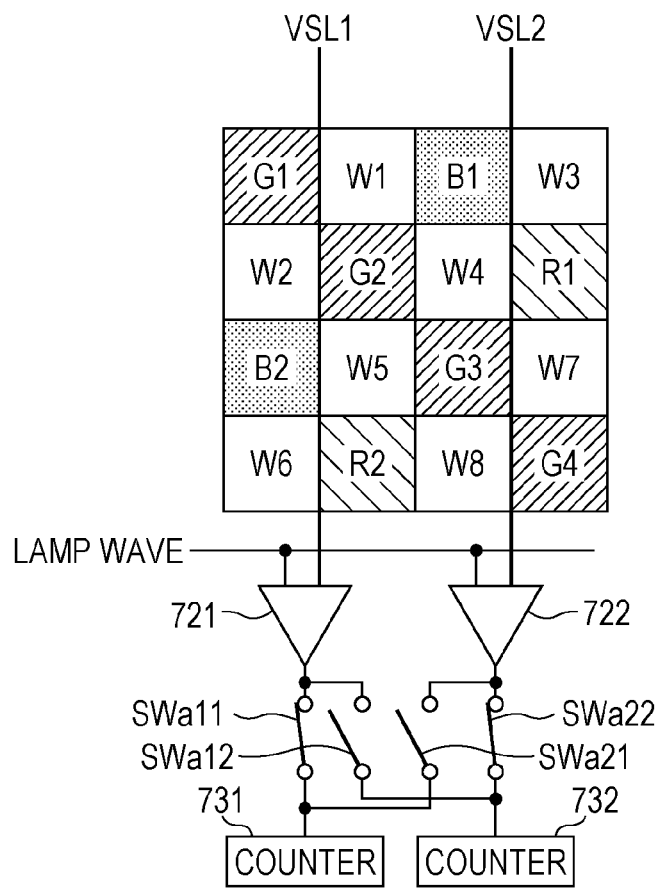

SOLID STATE IMAGING DEVICE, METHOD OF CONTROLLING SOLID STATE IMAGING DEVICE, AND PROGRAM FOR CONTROLLING SOLID STATE IMAGING DEVICE

BACKGROUND

The present disclosure relates to a solid state imaging device including a pixel array unit that has a plurality of 2-dimensionally arranged pixels in a matrix and a plurality of signal lines arranged along a column direction, and an A/D (analog/digital) conversion unit is provided corresponding to each signal line and converts an analog signal output from the pixel through the signal line into a digital signal, a method of controlling the solid state imaging device, and a program for controlling the solid state imaging device.

A pixel adding method in a solid state imaging device is known as an FD adding method of summing and outputting charges of pixels on a floating diffusion (hereinafter, referred to as FD) of the pixel, a source follower adding method of simultaneously reading a plurality of pixel signals through reading lines and adding the pixel signals using a load MOS circuit connected to the reading signal lines, a counter adding method of performing digital addition using a counter circuit in a column ADC circuit, and a capacity adding method of connecting a plurality of capacitors to input ends of a comparator in a column ADC circuit in parallel and adding signals of a plurality of vertical signal lines.

The pixel addition in decimation reading of Bayer arrangement will be described with reference to FIG. 29 to FIG. 31B. FIG. 29 is a diagram illustrating an example of pixel addition performed using a column ADC circuit when the Bayer arrangement is used as a color filter array, FIG. 30 is a timing chart at the time of the pixel addition in the column ADC circuit shown in FIG. 29, and FIG. 31A and FIG. 31B are reading images when the column ADC circuit shown in FIG. 29 is used.

In the Bayer arrangement shown in FIG. 29, G color filters used as main components of brightness signals are disposed at an interval of one pixel in a checkerboard shape, R and B color filters are arranged at the remaining pixels at a pitch of vertical and horizontal one pixel in a checkerboard shape, and the R and B color filters are disposed to obliquely deviate by one pixel. The pixel array shown in FIG. 29 is configured by a pixel unit (hereinafter, referred to as an FD sharing pixel unit) that shares the FD by connection of four pixels of vertical and horizontal 2×2 through a floating diffusion (hereinafter, referred to as FD).

In the configuration shown in FIG. 29, addition and addition averaging are performed, for example, as R1 and R2, G1 and G3, G2 and G4, B1 and B2, R3 and R4, G5 and G7, G6 and G8, and B3 and B4, the same vertical signal line is shared, the same color of pixels are sequentially input to the column ADC circuit in the vertical direction, are A/D-converted using the column ADC circuit of each column, and then the addition and the addition averaging is performed by a counter (for example, see Japanese Unexamined Patent Application Publication No. 2006-033454).

For example, as shown in FIG. 30, first, the pixel R1 and the pixel R3 are selected, the pixel signal of the pixel R1 is output to a vertical signal line VSL1, and the pixel signal of the pixel R3 is output to a vertical signal line VSL2. Then, the pixel R2 and the pixel R4 are selected, the pixel signal of the pixel R2 is output to the vertical signal line VSL1, and the pixel signal of the pixel R4 is output to the vertical signal line VSL2.

That is, the pixel signals of pixels R1 and R2 are sequentially output to the vertical signal line VSL1, and the pixel signals of pixels R3 and R4 are sequentially output to the vertical signal line VSL2. Accordingly, both pixel signals of the pixels R1 and R2 are counted by a counter CNT1, and both pixel signals of the pixels R3 and R4 are counted by a counter CNT2.

Similarly, the remaining pixels are sequentially selected and output to the vertical signal lines, and digital data subjected to counter addition by the counters are output.

FIG. 31A is a reading image in a state of addition in the column ADC circuit, and an image output from the column ADC circuit corresponds to a state where the number of pixels in the vertical direction is decimated by half.

Thereafter, the A/D conversion value of the pixel output from the column ADC circuit is transmitted to a logic signal processing circuit at the latter stage, and the addition and the addition averaging are performed therein in the horizontal direction. FIG. 31B is a reading image in a state of addition in the logic signal processing circuit, an image output from the logic signal circuit corresponds to a state where the number of pixels in both vertical and horizontal directions is decimated by half.

Recently, in a solid state imaging device, white as a main component of a brightness signal may be used in color arrangement of a color filter array (for example, see Japanese Unexamined Patent Application Publication No. 2010-136226).

FIG. 32 is an example of color arrangement of a color filter array including white. In the color arrangement shown in FIG. 32, white filters are disposed at a pitch of one pixel in a checkerboard shape, and RGB color filters are uniformly disposed at the remaining pixels. More specifically, the R and B color filters are arranged in checkerboard shape at a pitch of two pixels horizontally and vertically, the R and B color filters are disposed to obliquely deviate by one pixel, and the remaining pixels are the G color filters. In this case, the G filters are arranged in an oblique stripe shape.

In such color arrangement, it is difficult to perform the addition and the addition averaging using the column ADC circuit. Accordingly, the A/D conversion value of the pixel output from the column ADC circuit is transmitted to the logic signal processing circuit at the latter stage, the vertical direction addition and addition averaging and the horizontal direction addition and addition averaging are performed therein by a calculation process.

When the process of decimation of the addition and the addition averaging in the logic signal processing circuit is performed while using the color arrangement shown in FIG. 29, all sixteen pixels in the 4×4 pixel arrangement are selected, and the AD conversion is performed using the column ADC circuit provided corresponding to each vertical signal line to perform the addition and the addition averaging. That is, also at the time of the decimation outputting, it is necessary to operate all the ADC circuits, and power consumption in the column ADC circuits is not reduced.

It is necessary to transmit the addition and the addition averaging value obtained by the AD conversion to the logic signal processing unit at the latter stage and to perform the addition and the addition averaging in the horizontal direction. Accordingly, the logic signal processing unit at the latter stage has to be provided with a circuit for processing the received value or a line memory, which causes an increase of any of a circuit scale, an operation speed, and power consumption. Of course, these demerits in the logic signal processing unit are the same even in the case of the color arrangement of the filter array including the white shown in FIG. 32 described above.

In the FD addition method, and the source follower adding method, the counter adding method, and the capacity adding method in the related art described above, when the color arrangement shown in FIG. 32 is employed, it is physically difficult to perform the decimation outputting using the addition and the addition averaging in the pixels connected to the other vertical signal lines. In the case of the capacity adding method, it is possible to perform the decimation outputting using the addition and the addition averaging in the pixels connected to the adjacent vertical signal lines, but it may not be performed instead of the output method in which the decimation is not performed.

SUMMARY

It is desirable to provide a solid state imaging device, a method of controlling the solid state imaging device, and a program for controlling the solid state imaging device, capable of performing the decimation outputting based on addition and addition averaging in pixels connected to the other vertical signal line without increasing the circuit scale, the operation speed, and the power consumption.

According to an embodiment of the present disclosure, there is provided a solid state imaging device including: a pixel array unit that has a plurality of pixels 2-dimensionally arranged in a matrix and a plurality of signal lines arranged along a column direction; A/D conversion units that are provided corresponding to the respective signal lines and convert an analog signal output from a pixel through the signal line into a digital signal; and a switching unit that switches or converts the analog signal output through each signal line into a digital signal using any of an A/D conversion unit provided corresponding to the signal line through which the analog signal is transmitted, and an A/D conversion unit provided corresponding to a signal line other than the signal line through which the analog signal is transmitted.

The solid state imaging device described above includes various embodiments, for example, the solid state imaging device is embodied with the solid state imaging device provided in another apparatus or is embodied by another method. The present technology may be realized as an imaging system provided with the solid state imaging device, a control method having processes corresponding to the configurations of the device described above, a program for causing a computer to execute functions corresponding to the configurations of the device described above, a computer-readable recording medium in which the program is recorded, and a method of producing the solid state imaging device.

As described above, according to the present technology, it is possible to provide a solid state imaging device capable of performing the decimation outputting based on addition and addition averaging in pixels connected to the other vertical signal line without increasing a circuit scale, an operation speed, and power consumption.

BRIEF DESCRIPTION OF THE DRAWINGS

FIG. 4 is a diagram illustrating an example of a circuit in which the switch according to the first embodiment is specifically realized.

FIG. 5 is a truth table of a control signal according to the first embodiment.

FIG. 13 is a diagram illustrating configurations of a color filter array and a column processing unit according to the first embodiment.

FIG. 14 is a timing chart according to an addition operation of the first embodiment.

FIG. 31B is used.

DETAILED DESCRIPTION OF EMBODIMENTS

Hereinafter, embodiments of the present technology will be described in the following order.
(1) Configuration of Solid State Imaging Device:
(2) First Embodiment of Pixel Addition:
(3) Second Embodiment of Pixel Addition:
(4) Third Embodiment of Pixel Addition:
(5) Various Modification Examples:

(1) Configuration of Solid State Imaging Device

Figure 1:
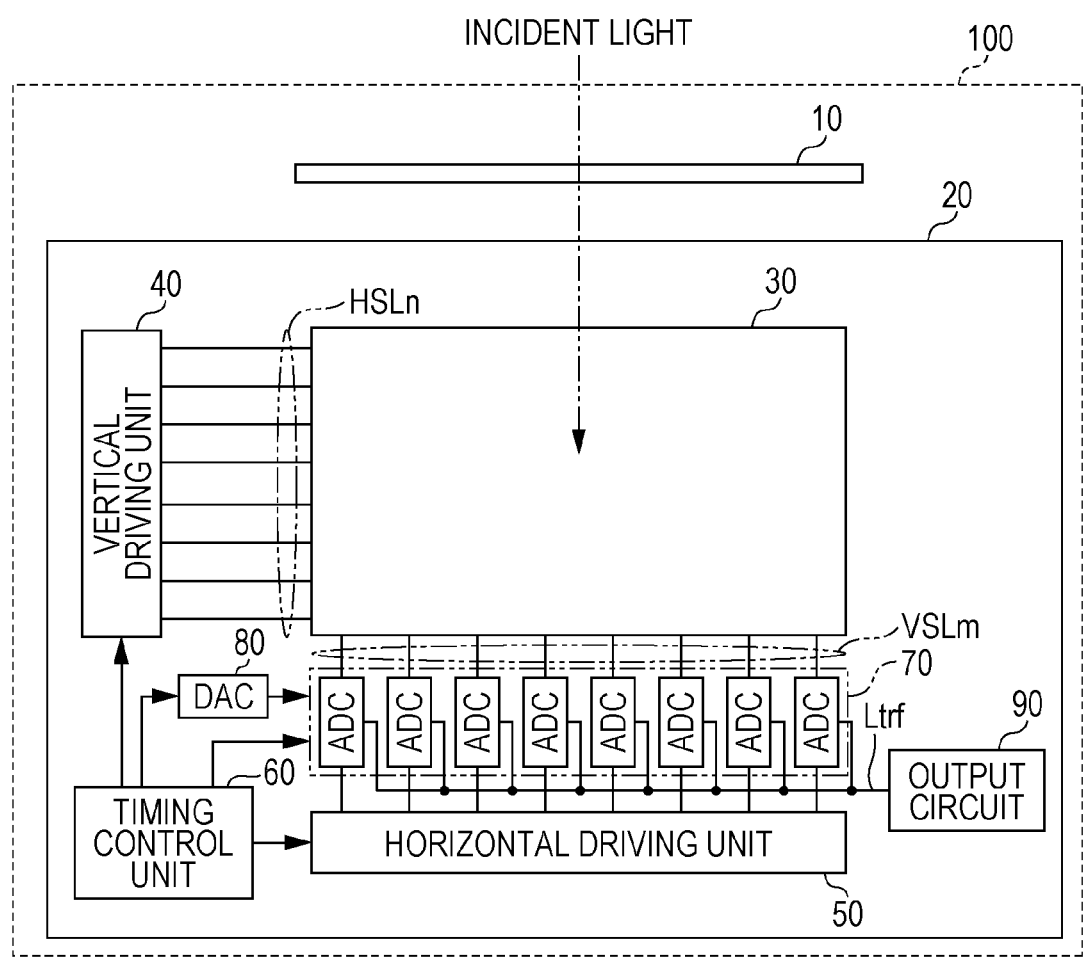
FIG. 1 is a block diagram illustrating a configuration of a solid state imaging device.

FIG. 1 is a block diagram illustrating a configuration of a solid state imaging device. In the embodiment, a CMOS image sensor that is a kind of X-Y address type solid state imaging device will be described as an example of an imaging device.

Hereinafter, it will be described that NMOS is used in all the pixels of the CMOS image sensor, but this is an example, a device that is a target of the present technology is not limited to the MOS type solid state imaging device. For example, a plurality of unit constituent elements having sensitivity with respect to electromagnetic waves input from the outside such as light and radiation are arranged in line or matrix, and all the embodiments are similarly applied to all the semiconductor devices for detecting physical distribution to read a signal by an address control.

The solid state imaging device 100 has a pixel unit in which a plurality of pixels including light receiving elements outputting a signal corresponding to incident light quantity are 2-dimensionally disposed in a matrix, a signal output from each pixel is a voltage signal, and AD conversion units (ADC: Analog Digital Converters) are provided in line parallel.

Herein, the line parallel means that the same number of AD conversion units as the number of vertical signal lines (an example of column signal lines) disposed in parallel with the vertical columns of the pixels constituting the image sensor are disposed one-to-one corresponding to the vertical signal lines, and one AD conversion unit corresponds to one line (one vertical signal line).

As a general example in which the ADC circuits are provided in line parallel, there is a column type in which an analog signal processing unit or an ADC circuit is provided for each vertical signal line at a portion called a column area provided on the output side of an imaging unit, and signals are sequentially read on the output side.

The present disclosure is not limited to the column type (the line parallel type), and a type of assigning one ADC circuit to a plurality of (for example, two) adjacent vertical signal lines, or a type of assigning one ADC circuit to N (N is an integer: N−1 vertical signal lines are disposed therebetween) vertical signal lines of N intervals may be employed.

Even in any type other than the column type, a plurality of vertical signal lines share one ADC circuit, and thus a switching circuit (a switch) that supplies a plurality of pixel signals corresponding to a plurality of columns supplied from the pixel array unit 30 to one ADC circuit is provided. According to a process at the latter stage, a separate countermeasure is necessary, for example, a memory for storing an output signal is provided.

Various AD conversion methods are conceivable from the viewpoint of circuit scale, processing speed (a high speed), and resolution, for example, there is a slope integration type or a ramp signal comparison type (hereinafter, in the specification, a reference signal comparison type).

In the reference signal comparison type, an analog signal that is a target of AD conversion is compared with a ramp-shaped reference signal (a ramp wave), a value of which is gradually changed, and a digital value of the analog signal that is the target of the AD conversion is acquired on the basis of a count value obtained by counting a continuation time of a comparison process. In the embodiment, there is a ramp signal comparison type AD conversion method.

When the reference signal comparison type AD conversion method is employed, it is conceivable to provide a plurality of reference signal generating units. For example, a reference signal generating unit that supplies reference signal to odd numbered columns in vertical signal lines and a reference signal generating unit that supplies reference signals to even numbered columns may be provided, or the reference signal generating units may be provided in line parallel (for each signal line).

However, when the plurality of reference signal generating units are provided, a circuit scale or power consumption is increased. In the embodiment, the reference signal generating unit is provided commonly with all the columns, and the column type ADC circuit provided corresponding to each vertical signal line commonly uses the reference signal generated from the reference signal generating unit.

Hereinafter, a specific example of a solid state imaging device will be described with reference to FIG. 1. As shown in FIG. 1, a solid state imaging device 100 includes a color filter array 10 and a semiconductor substrate 20.

The semiconductor substrate 20 is provided with a pixel array unit 30, a vertical driving unit 40, a horizontal driving unit 50, a timing control unit 60, a column processing unit 70, a reference signal generating unit 80, and an output circuit 90. A digital operation unit may be provided at the front end of the output circuit 90 as necessary. The digital operation unit is provided, for example, when a process of decimation pixel signals in the horizontal direction or vertical direction is performed by addition and addition averaging.

The pixel array unit 30 is provided with a color filter array 10 in which colors of filters are classified corresponding to pixels on the light reception face side, and pixels PXL including a photodiode as a photoelectric conversion element are arranged in a matrix. A specific circuit configuration of the pixel PXL and color arrangement of the color filter array 10 will be described later in detail.

The pixel array unit 30 is provided with n pixel driving lines HSLn (n is an integer equal to or more than two) and m vertical signal lines VSLm (m is an integer equal to or more than two). The pixel driving lines HSLn are disposed at the same distance along the left and right direction of the figure (a pixel arrangement direction of pixel rows, and a horizontal direction), the vertical signal lines VSLm are disposed at the same distance along the up and down direction of the figure (a pixel arrangement direction of pixel columns, and a vertical direction).

One end of the pixel driving line HSLn is connected to an output terminal corresponding to each row of the vertical driving unit 40. One end of the vertical signal line VSLm is connected to an ADC circuit corresponding to each vertical signal line VSLm in the column processing unit 70. In addition, specific disposition of the pixel driving lines HSLn and the vertical signal lines VSLm will be described with the description of a unit pixel to be described later.

The driving control unit including the vertical driving unit 40, the horizontal driving unit 50, the timing control unit 60, and the like is provided on the outside of the pixel array unit 30, and performs a control of sequentially reading signals from the pixels constituting the pixel array unit 30.

The timing control unit 60 includes a timing generator and a communication interface. The timing generator generates various clock signals on the basis of a clock (a master clock) input from the outside. The communication interface receives data of instructing an operation mode given from the outside of the semiconductor substrate 20, and outputs data including internal information of the solid state imaging device 100.

The timing control unit 60 generates a clock with the same frequency as that of the master clock, a clock formed by dividing it by two, and a low speed clock formed by further dividing it, and supplies the clocks to, for example, the vertical driving unit 40, the horizontal driving unit 50, and the column processing unit 70.

The vertical driving unit 40 is formed of a shift register or an address decoder, and is provided with a vertical address setting unit for controlling a row address or a row scanning control unit for controlling row scanning. The vertical driving unit 40 can perform reading scanning and flushing scanning.

The reading scanning is scanning of sequentially selecting the unit pixels reading signals. This scanning is sequentially performed basically in units of rows. However, when the outputs of the plurality of pixels in a predetermined positional relationship are subjected to addition or addition averaging to perform decimation of the pixels, the scanning is performed in a predetermined sequence to be described later.

The flushing scanning is preceded from the reading scanning by a time of a shutter speed in the row in which the reading is performed in the reading scanning or the pixel combination, and is to reset the unit pixels belonging to the row in which the reading is performed or the pixel combination.

The horizontal driving unit 50 sequentially selects the ADC circuits of the column processing unit 70 by synchronizing with the clock output from the timing control unit 60, and leads the signal to the horizontal signal line (the horizontal output line) Ltrf.

The horizontal driving unit 50 is provided with a horizontal address setting unit that regulates (selects individual ADC circuits in the column processing unit 70) a reading column in the horizontal direction, and a horizontal scanning unit that leads the signals of the column processing unit 70 to the horizontal signal lines Ltrf according to the reading address regulated in the horizontal address setting unit.

The pixel signals which are signal-processed using the ADC circuits constituting the column processing unit 70 by the selective scanning of the horizontal scanning unit are sequentially output to the output circuit 90 through the horizontal signal lines Ltrf.

The reference signal generating unit 80 is provided with a DAC (Digital Analog Converter), synchronizes with the count clock supplied from the timing control unit 60 from the initial value supplied from the timing control unit 60, generates a saw-tooth wave (a ramp waveform) which is time-variable stepwise, and supplies the signal as the reference signal to the individual ADC circuits of the column processing unit 70. Hereinafter, the reference signal generating unit 80 may be referred to as the DAC 80.

The reference signal generating unit 80 adjusts a cycle of the count clock. Accordingly, when a clock in which the slope of the reference signal can be adjusted, for example, a clock divided by 1/m with respect to the reference clock is used, it is possible to make the slope to 1/m. In this case, when the count clock supplied to the counter to be described later included in the ADC circuit is as reference, the count value is m times. That is, by adjusting the cycle of the count clock, it is possible to adjust the count value in the counter to be described later.

For example, when the analog values of two pixels are sequentially counted in the ADC circuit as will be described later, it can be realized by doubling the range of AD conversion in order to perform addition averaging of two pixels on the generated count values. When the reference signal of the reference signal generating unit 80 is used, for example, it is possible to double the range of AD conversion by making the slope of the reference signal double the normal clock.

The column processing unit 70 is provided with an ADC circuit 71m (m is an integer equal to or more than two) provided for each vertical signal line VSLm, converts the analog signal output from the vertical signal line VSLm into a digital signal, and outputs the digital signal to the horizontal signal line Ltrf according to the control of the horizontal driving unit 50. Hereinafter, when description is performed without attaching reference numerals corresponding to m to the ADC circuit 71m or the internal configurations (a comparator 72m, a counter 73m and a memory 74m), the description is common in the ADC circuits.

Figures 2, 3:
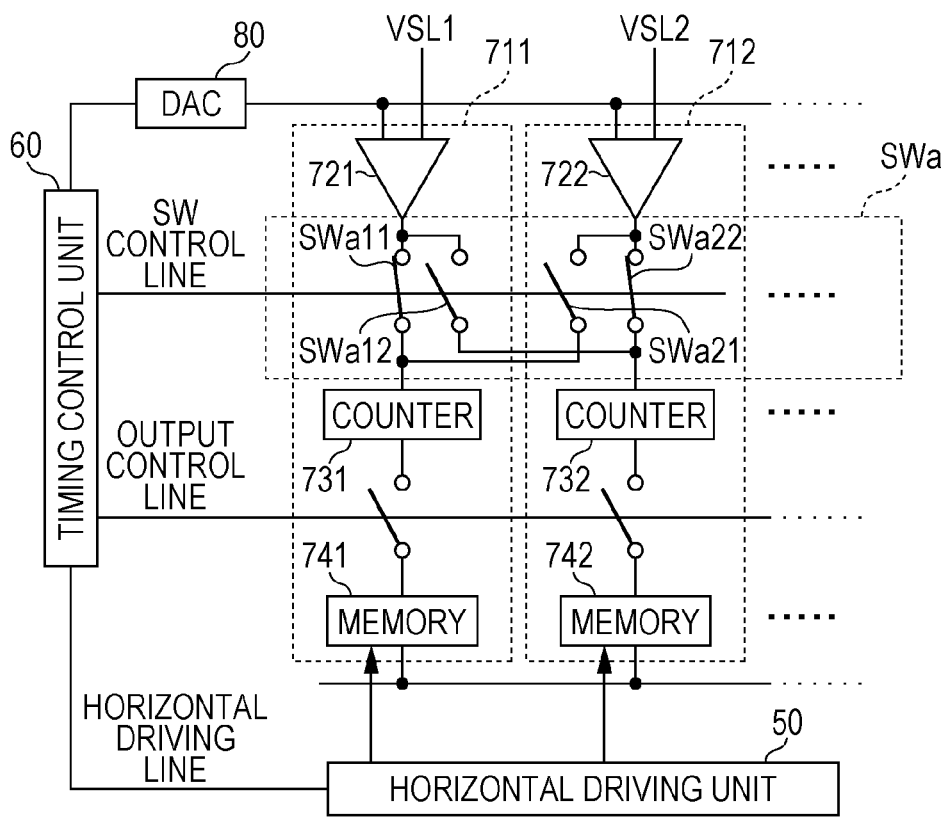
FIG. 2 is a diagram illustrating a column processing unit according to a first embodiment.
FIG. 3 is a table illustrating correspondence of ON/OFF of a switch according to the first embodiment.
Figures 6, 7:
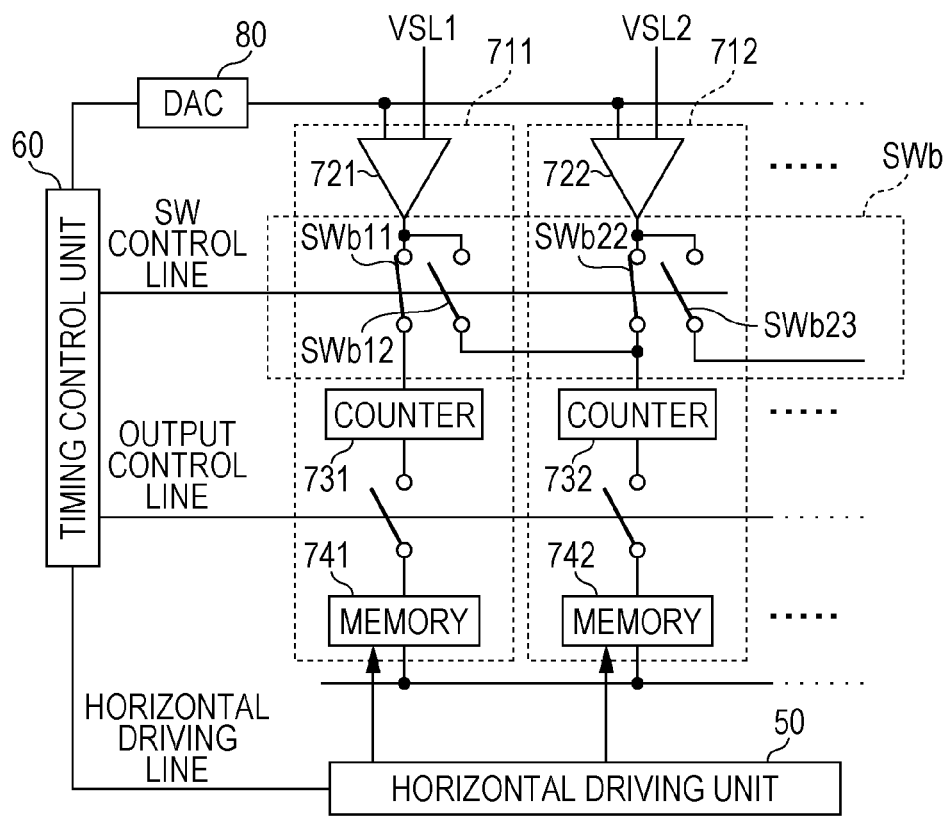
FIG. 6 is a diagram illustrating a column processing unit according to a second embodiment.
FIG. 7 is a table illustrating correspondence of ON/OFF of a switch according to the second embodiment.

In the embodiment, as shown in FIG. 2 and FIG. 6, the ADC circuit 71 includes a comparator 72, a counter 73, and a memory 74. The ADC circuit 71 is an example of the A/D conversion unit.

The comparator 72 receives the reference signal generated by the reference signal generating unit 80 and the analog pixel signal output from the pixel through the vertical signal line, and compares the reference signal with the pixel signal. The comparator 72 outputs a high level signal or a low level signal according to a magnitude relationship between the reference signal and the pixel signal. When the magnitude relationship between the reference signal and the pixel signal is changed, the output is inverted between the high level and the low level.

The clock is supplied from the timing control unit 60 to the counter 73, and the counter 73 counts the time from start to end of AD conversion (a count operation valid period). The timing of start and end of AD conversion may be specified on the basis of the start timing of change of the reference signal or the output inversion of the comparator 72. The reason is because the output inversion of the comparator 72 corresponds to the comparison start or the comparison end of the reference signal and the pixel signal.

The count value generated by the counter 73 is a digital value, and is digital data corresponding to the analog pixel signal input from the pixel to the column processing unit 70 through the vertical signal line VSLm. The generated data of the counter 73 is stored (latched) in the memory 74.

When count value is generated using a reset component, for example, the counter 73 performs a down count operation according to the control of the timing control unit 60 while the analog signal corresponding to the reset component is output from the vertical signal line VSLm, and performs an up count operation reverse to the case of the reset component while the analog signal corresponding to the signal component is output from the vertical signal line. The count value generated as described above is a digital value corresponding to a difference between the signal component and the reset component, and is a signal component corrected by the reset component.

The output circuit 90 performs a process of converting the signal output from the pixel array unit 30 to the column processing unit 70 and corresponding to the color arrangement of the color filter array 10 into the color arrangement by the calculation process.

FIG. 2 is a diagram illustrating the column processing unit 70 according to a first embodiment. In FIG. 2, for simplification of description, two vertical signal lines are shown, and also two ADC circuits included in the column processing unit 70 are shown.

In FIG. 2, the column processing unit 70 includes ADC circuits 711 and 712, and a switch circuit SWa. The ADC circuit 71 is provided with a comparator 72, a counter 73, and a memory 74. The comparator 72 and the counter 73 provided in the ADC circuit 71 are connected through the switch circuit SWa. The functions of the comparator, the counter, and the memory are as described above.

The switch circuit SWa is provided with a switch SWa11, SWa12, SWa21, and SWa22. The comparator 721 and the counter 731 are connected through the switch SWa11, and the comparator 722 and the counter 732 are connected through the switch SWa22. The comparator 721 and the counter 732 are connected through the switch SWa12, and the comparator 722 and the counter 731 are connected through the switch SWa21.

That is, the switch circuit SWa includes a switch connecting the comparator and counter provided corresponding to the same vertical signal line, and a switch connecting a comparator provided corresponding to one of a set of two adjacent vertical signal lines and a counter provided corresponding to the other.

By connection through two kinds of switches, it is possible to perform selective counting using any one of the counter provided corresponding to one vertical signal line and the counter provided corresponding to the other vertical signal line in the set of adjacent vertical signal lines.

Specifically, when the switch SWa11 is turned on, it is possible to digital-convert and store the analog signal of the pixel connected to the vertical signal line VSL1 by the counter 731, and when the switch SWa12 is turned on, it is possible to digital-convert and store the analog signal of the pixel connected to the vertical signal line VSL1 by the counter 732.

When the switch SWa22 is turned on, it is possible to digital-convert and store the analog signal of the pixel connected to the vertical signal line VSL2 by the counter 732, and when the switch SWa21 is turned on, it is possible to digital-convert and store the analog signal of the pixel connected to the vertical signal line VSL2 by the counter 731.

By summing up the count while the switch SWa11 is turned on and the count while the switch SWa21 is turned on by addition, it is possible to cause the counter 731 to generate the digital data formed by summing up the pixel value of the pixel connected to the vertical signal line VSL1 and the pixel value of the pixel connected to the vertical signal line VSL2.

Similarly, by summing up the count while the switch SWa22 is turned on and the count while the switch SWa12 is turned on by addition, it is possible to cause the counter 732 to generate the digital data formed by summing up the pixel value of the pixel corrected to the vertical signal line VSL1 and the pixel value of the pixel connected to the vertical signal line VSL2.

The counter addition may be realized, after the counting of one pixel signal is completed, by continuing the counting, using the count value according to the one pixel signal as an initial value of the counting of the other pixel signal.

The ON/OFF control of the switches SWa11, SWa12, SWa21, and SWa22 is performed according to the control performed through the SW control line by the timing control unit 60 (the switching control unit). FIG. 3 is a table illustrating ON/OFF correspondence of the switches SWa11, SWa12, SWa21, and SWa22.

As shown in FIG. 3, the switch SWa11 and the switch SWa12 are selectively turned on, and the switch SWa22 and the switch SWa21 are selectively turned on. Meanwhile, the ON/OFF of the switch SWa11 and the ON/OFF of the switch SWa22 are interlinked, and also the ON/OFF of the switch SWa12 and the ON/OFF of the switch SWa21 are interlinked.

Hereinafter, the column processing unit 70 connected such that the outputs are switchable between the ADC circuits corresponding to a set of adjacent vertical signal lines as described above may be referred to as "cross-connection type column processing unit".

As described above, by appropriately selecting the counter taking in charge of AD conversion by the switch, it is possible to generate digital data formed by summing up the pixel values of the pixels connected to the set of adjacent vertical signal lines by one counter.

The switch circuit SWa is formed as a part of the column processing unit 60, and is disposed at the column portion (the outside of the pixel array). That is, the disposition of the switch circuit SWa is not particularly limited, and there is a merit of corresponding to various combinations according to pixel arrangement. The input destination of the digital value as the comparator output which can be taken as only one of High and Low is switched, and thus it is easy to case noise at the time of switching.

FIG. 4 is a diagram illustrating an example in which the switches SWa11, SWa12, SWa21, and SWa22 are specifically realized. The switch shown in FIG. 4 has a configuration of complementary switches in which an NMOS transistor and a PMOS transistor are combined.

The complementary switches are controlled by control signals transmitted through two control lines La1 and La2. Hereinafter, the control signal transmitted through the control line La1 is referred to as CROSS, and the control signal transmitted through the control line La2 is referred to as XCROSS.

The complementary switches are analog switches including two complementary MOS field effect transistors, and are analog switches in which a source-drain circuit is disposed in parallel between the input terminal and the output terminal of the switch, the control signal for controlling the switch can be directly applied to a gate of one channel MOS field effect transistor, and can be applied to a gate of the other channel MOS field effect transistor through an inverter.

The control signals CROSS and XCROSS are signals in which positivity and negativity are logic-inverted to each other, and the output of the comparator provided corresponding to one vertical signal can be input to the counter provided corresponding to the same one vertical signal line or can be input to the counter provided corresponding to the other vertical signal, according to the signal state.

FIG. 5 is a truth table of the control signals XCROSS and CROSS.

As shown in FIG. 5, when the control signal XCROSS transmitted through the control line La1 is positive logic (High) and the control signal CROSS transmitted through the control signal La2 is negative logic (Low), the switches SWa11 and SWa22 are turned on, and the switches SWa12 and SWa21 are turned off.

In this case, the output of the comparator provided corresponding to one vertical signal line is input to the counter provided corresponding to the same one vertical signal line. That is, the analog pixel signal output from one vertical signal line is converted into digital data as a count value in the counter provided corresponding to the same one vertical signal line.

Meanwhile, when the control signal XCROSS transmitted through the control line La1 is negative logic and the control signal CROSS transmitted through the control line La2 is positive logic, the switches SWa11 and SWa22 are turned off, and the switches SWa12 and SWa21 are turned on.

In this case, the output of the comparator provided corresponding to one vertical signal line is input to the counter provided corresponding to the other vertical signal line. That is, the analog pixel signal output from one vertical signal line is converted into digital data as a count value in the counter provided corresponding to the other vertical signal line.

According to the complementary switches described above, it is possible to realize the switch circuit with the simple configuration by combination of the PMOS field effect transistor and the NMOS field effect transistor. In a process of producing CMOSLSI, it is possible to mount the switch circuit.

FIG. 6 is a diagram illustrating a column processing unit 70 according to a second embodiment. In FIG. 6, for simplification of description, two vertical signal lines are shown, and also two ADC circuits included in the column processing unit 70 are shown.

In FIG. 6, the column processing unit 70 includes ADC circuits 711 and 712, and a switch circuit SWb. The ADC circuit 71 is provided with a comparator 72, a counter 73, and a memory 74. The comparator 72 and the counter 73 provided in the ADC circuit 71 are connected through the switch circuit SWb. The functions of the comparator, the counter, and the memory are as described above.

The switch circuit SWb is provided with a switch SWb11, SWb12, SW22, and SWb23. The comparator 721 and the counter 731 are connected through the switch SWb11, and the comparator 722 and the counter 732 are connected through the switch SWb22. The comparator 721 and the counter 732 are connected through the switch SWb12, and the comparator 722 and the counter 733 provided in an ADC circuit 713 (not shown) are connected through the switch SWb23.

That is, the switch circuit SWb includes a switch connecting the comparator and counter provided corresponding to one vertical signal line, and a switch connecting a comparator provided corresponding to one vertical signal line and a counter provided corresponding to a vertical signal line adjacent to one side of one vertical signal line. The one side described herein is, for example, the right side in FIG. 6, and is the same side in all the vertical signal lines provided in one solid state imaging device.

For this reason, it is possible to select any one of the counter provided corresponding to the vertical signal line and the counter provided corresponding to the vertical signal line provided to be adjacent to one side of the vertical signal line, and to perform the counting.

Herein, when the switch SWb11 is turned on, it is possible to digital-convert and store the analog signal of the pixel connected to the vertical signal line VSL1 by the counter 731, and when the switch SWb12 is turned on, it is possible to digital-convert and store the analog signal of the pixel connected to the vertical signal line VSL1 by the counter 732.

When the switch SWb22 is turned on, it is possible to digital-convert and store the analog signal of the pixel connected to the vertical signal line VSL2 by the counter 732, and when the switch SWb23 is turned on, it is possible to digital-convert and store the analog signal of the pixel connected to the vertical signal line VSL3 (not shown) by the counter 733 (not shown).

When the count while the switch SWb12 is turned on and the count while the switch SWb22 is turned on by addition are summed up by addition, it is possible to cause the counter 732 to generate digital data formed by summing up the pixel value of the pixel connected to the vertical signal line VSL1 and the pixel value of the pixel connected to the vertical signal line VSL2 provided to be adjacent to the right side of the vertical signal line VSL1.

Similarly, when the count while the switch SWb23 is turned on and the count while the switch SWb33 is turned on by addition are summed up by addition, it is possible to cause the counter 733 to generate digital data formed by summing up the pixel value of the pixel connected to the vertical signal line VSL2 and the pixel value of the pixel connected to the vertical signal line VSL3 (not shown). The vertical signal line VSL3 (not shown) is a vertical signal line provided to be adjacent to the right side of the vertical signal line VSL2, and the counter 733 (not shown) is a counter provided corresponding to the vertical signal line VSL3.

The ON/OFF of the switch is controlled according to the control of the timing control unit 60 (the switching control unit) performed through the SW control line.

FIG. 7 is a table illustrating ON/OFF correspondence of the switches SWb11, SWb12, SWb22, and SWb23. The ON/OFF correspondence of the switches SWb11, SWb12, SWb22, and SWb23 is periodically applied to the switches provided on the more right side than the switches SWb11, SWb12, SWb22, and SWb23. For example, the switch SWb33 (not shown) described above has the same ON/OFF correspondence as that of the switch SWb11.

As shown in FIG. 7, the switch SWb11 and the switch SWb12 are selectively turned on, and the switch SWb22 and the switch SWb23 are also selectively turned on. Meanwhile, the ON/OFF of the switch SWb11 and the ON/OFF of the SWb22 are interlinked, and also the ON/OFF of the switch SWb12 and the ON/OFF of the switch SWb23 are interlinked.

Hereinafter, the column processing unit connected such that the output of each vertical signal line can be shifted and output to the vertical signal line adjacent to one side thereof may be referred to as "shift-connection type column processing unit".

As described above, the AD conversion of the pixel signal of the pixel connected to each vertical signal line is selectively performed by one counter between the counter provided corresponding to the vertical signal line, and the counter provided corresponding to the vertical signal line provided by shifting from the vertical signal line to one side, and thus it is possible to generate the digital data formed by summing up the pixel values of the pixels connected to two adjacent vertical signal lines.

The switch circuit SWb is formed a part of the column processing unit 60 similarly to the case of the cross-connection type column processing unit described above, and is disposed at the column portion (the outside of the pixel array). That is, the disposition of the switch circuit SWb is not particularly limited, and there is a merit of corresponding to various combinations according to pixel arrangement. The input destination of the digital value as the comparator output which can be taken as only one of High and Low is switched, and thus it is easy to case noise at the time of switching.

Figures 8, 9:
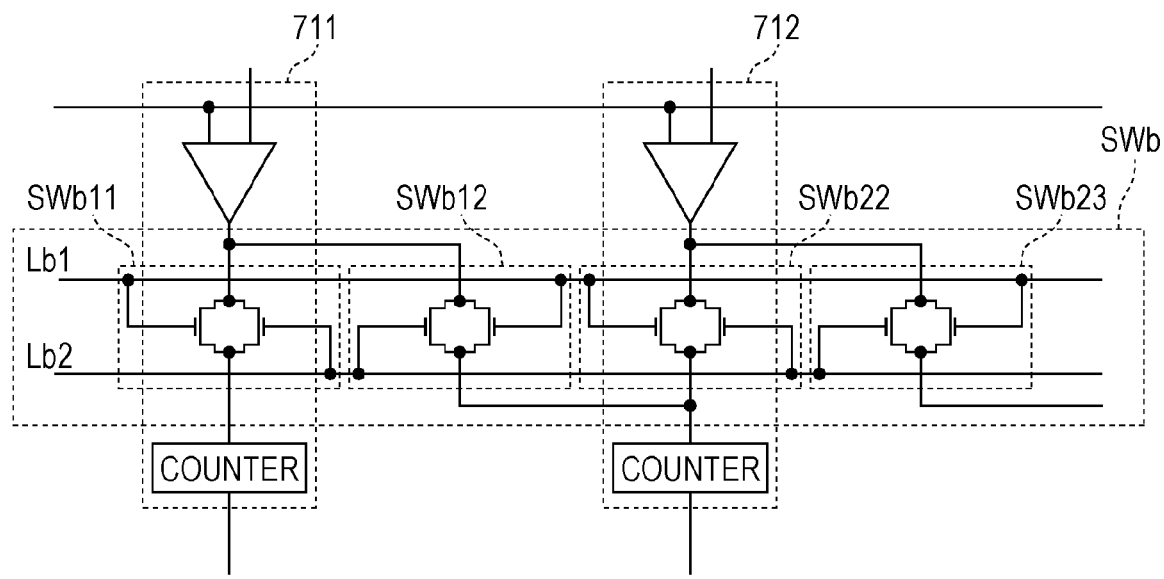
FIG. 8 is a diagram illustrating an example of a circuit in which the switch according to the second embodiment is specifically realized.
FIG. 9 is a truth table of a control signal according to the second embodiment.

FIG. 8 is a diagram illustrating an example in which the switches SWb11, SWb12, SWb22, and SWb23 are specifically realized. Similarly to the case of FIG. 4 described above, the switch shown in FIG. 8 has a configuration of complementary switches in which an NMOS transistor and a PMOS transistor are combined.

FIG. 9 is a truth table of the control signals XCROSS and CROSS.

As shown in FIG. 9, when the control signal XCROSS transmitted through the control line Lb1 is positive logic (High) and the control signal CROSS transmitted through the control signal La2 is negative logic (Low), the switches SWb11 and SWb22 are turned on, and the switches SWb12 and SWb23 are turned off. Accordingly, the output of the comparator provided corresponding to each vertical signal line is input to the counter provided corresponding to the same vertical signal line. That is, the analog pixel signal output from each vertical signal line is converted into digital data as a count value in the counter provided corresponding to the same one vertical signal line.

Meanwhile, when the control signal XCROSS transmitted through the control line Lb1 is negative logic (Low) and the control signal CROSS transmitted through the control line Lb2 is positive logic (High), the switches SWb11 and SWb22 are turned off, and the switches SWb12 and SWb23 are turned on. Accordingly, the output of the comparator provided corresponding to each vertical signal line is input to the counter provided corresponding to the vertical signal line provided to be adjacent to the right side. That is, the pixel signal output from each vertical signal line is converted into digital data as a count value in the counter provided corresponding to the vertical signal line provided to be adjacent to the right side.

According to the complementary switches described above, similarly to the case of the column processing unit on the cross-connection side, it is possible to realize the switch circuit with the simple configuration by combination of the PMOS field effect transistor and the NMOS field effect transistor. In a process of producing CMOSLSI, it is possible to mount the switch circuit.

Next, a specific circuit configuration of the unit pixel will be described. The pixel PXL of the embodiment has a configuration in which the plurality of pixels (for example, four pixels) share the floating diffusion FD. However, hereinafter, a basic pixel configuration will be first described, and then the configuration in which four pixels share the floating diffusion FD will be described.

Figure 10:
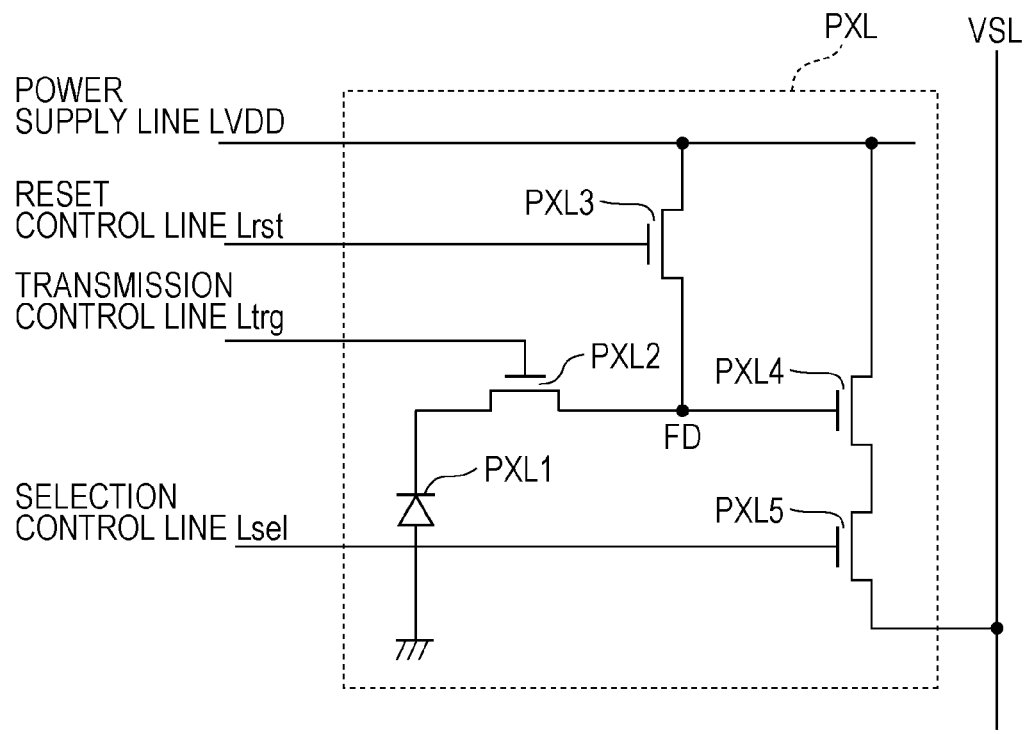
FIG. 10 is a circuit diagram illustrating an example of a basic pixel circuit of a CMOS image sensor.

FIG. 10 is a circuit diagram illustrating an example of a basic pixel circuit of a CMOS image sensor formed of four transistors. The pixel circuit shown in FIG. 10 includes a photodiode PXL1 as a light receiving element, a transmission transistor PXL2 as a transmission element, a transmission transistor PXL3 as a reset element, an amplification transistor PXL4, and a selection transistor PXL5.

The photodiode PXL1 photoelectrically converts incident light into an amount of charges (herein, electrons) corresponding to light quantity thereof.

The transmission transistor PXL2 is connected between a cathode of the photodiode PXL1 and the floating diffusion FD as the output node. The transmission transistor PXL2 is turned on when a transmission signal is input to a gate thereof (a transmission gate) through a transmission control line Ltrg. When the transmission transistor PXL2 is turned on, signal charges (herein, optical electrons) accumulated by photoelectric conversion of the photodiode PXL1 are transmitted to the floating diffusion FD.

A drain of the reset transistor PXL3 is connected to a power supply line LVDD, and a source thereof is connected to the floating diffusion FD. In the reset transistor PXL3, a reset signal is input from the vertical driving unit 40 to a gate thereof through a reset control line Lrst. The reset transistor PXL3 is turned on when a reset pulse is given thereto before the charge transmission from the photodiode PXL1, and resets potential of the floating diffusion FD to potential of the power supply line LVDD by abandoning the charges of the floating diffusion FD to the power supply line LVDD.

A gate of the amplification transistor PXL4 is connected to the floating diffusion FD. The amplification transistor PXL4 is connected to the vertical signal line VSL through the selection transistor PXL5.

The selection transistor PXL5 is turned on when a control signal (an address signal or a selection signal) is input to a gate thereof through the selection control line Lse1.

When the selection transistor PXL5 is turned on, the amplification transistor PXL4 amplifies the potential of the floating diffusion FD, and outputs voltage corresponding to the potential to the vertical signal line VSL. The voltage output from each pixel through the vertical signal line VSL is output to the column processing unit 70.

Next, the pixel circuit in which the plurality of pixels share the floating diffusion FD will be described. Hereinafter, the plurality of pixels sharing the floating diffusion FD are referred to as "FD sharing pixel unit".

Figure 11:
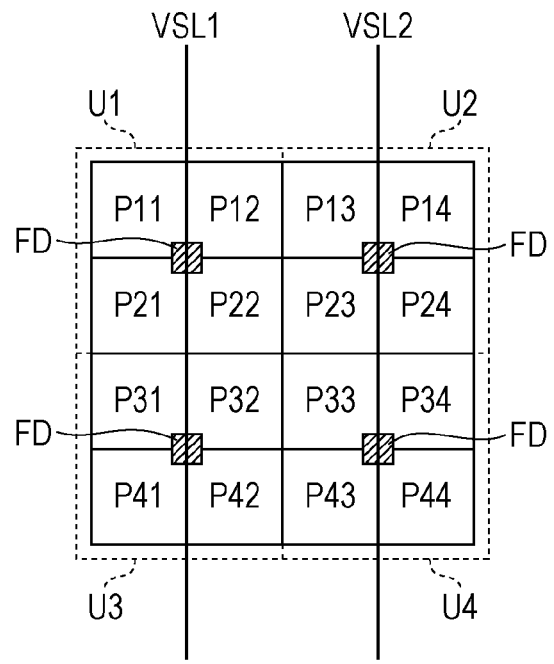
FIG. 11 is a diagram illustrating an FD sharing pixel unit.

FIG. 11 is a diagram illustrating the FD sharing pixel unit. In FIG. 11, the pixel array is configured by 16 pixels of 4×4, and is configured by combination of the FD sharing pixel units U1 and U4 configured by four pixels of 2×2. Each FD sharing pixel unit shares the FD at the center thereof, the vertical signal line VSL1 is connected to the FDs of the FD sharing units U1 and U3, and the vertical signal line VSL2 is connected to the FDs of the FD sharing pixel units U2 and U4.

In the FD sharing pixel units, pixels having the common positional relationship based on the FD for the FD sharing pixel units in a plurality of pixels belonging to the same line are driven by the same pixel driving line, and pixels which do not have the common positional relationship based on the FD for the FD sharing pixel units are driven by the other pixel driving line.

Specifically, in FIG. 11, each of the pixels P11 to P14, the pixels P21 to P24, the pixels P31 to P34, and the pixels P41 to P44 belong to the same line. For example, in the line of the pixels P11 to P14, the pixel P11 and the pixel P13 are driven by the same pixel driving line, and the pixel P12 and the pixel P14 are driven by the same pixel driving line.

Of course, the combination of the pixels and the pixel driving lines described above is an example, and may be variously modified. For example, by simultaneously driving two or more pixels sharing the FD, a value formed by adding analog values of two pixels is generated in the FD, and the FD-added analog value may be output to the vertical signal line.

Next, a specific circuit configuration of the FD sharing pixel unit will be described.

Figure 12:
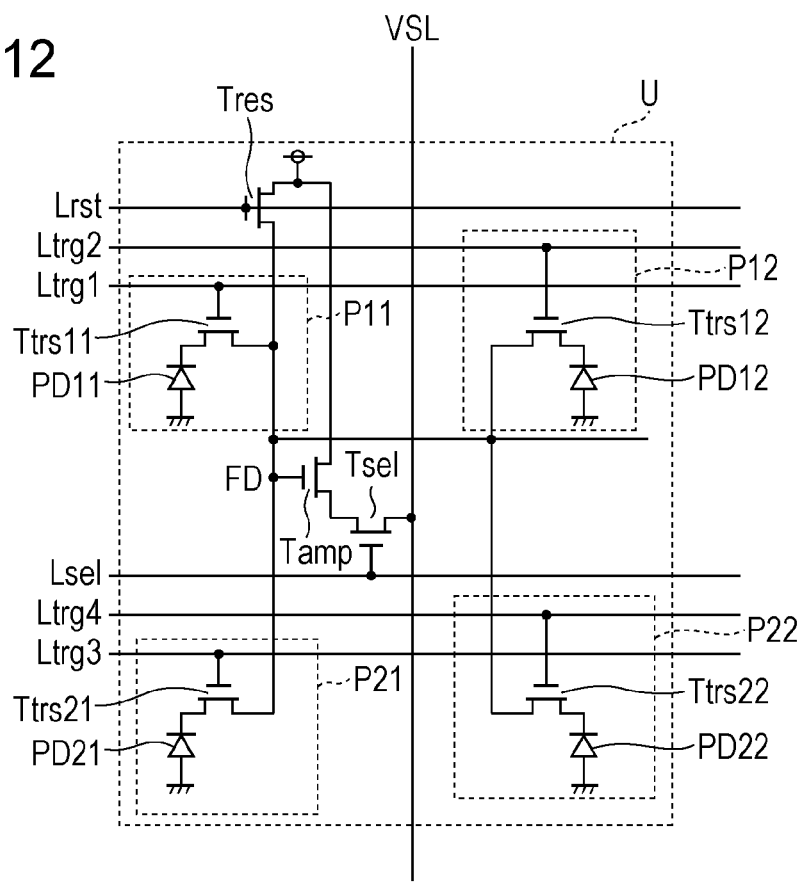
FIG. 12 is a circuit diagram illustrating an example of a circuit configuration of the FD sharing pixel unit.

FIG. 12 is a circuit diagram illustrating an example of a circuit configuration of the FD sharing pixel unit.

In FIG. 12, the FD sharing pixel unit U is configured by the pixels P11, P12, P21, and P22.

Each unit pixels of the FD sharing pixel unit U includes one of photodiodes PD11, PD12, PD21, and PD22, and one of transmission transistors Ttrs11, Ttrs12, Ttrs21, and Ttrs 22.

In the line in which the pixels P11 and P12 are disposed, the transmission control lines Ltrg1 and Ltrg2 are disposed, and in the line in which the pixels P21 and P22 are disposed, the transmission control lines Ltrg3 and Ltrg 4 are disposed.

The transmission control line Ltrg1 is connected to a gate of the transmission transistor Ttrs11 of the first pixel P11, and the transmission control line Ltrg2 is connected to a gate of the transmission transistor Ttrs12 of the first pixel P12. The transmission control line Ltrg3 is connected to a gate of the transmission transistor Ttrs21 of the second pixel P21, and the transmission control line Ltrg4 is connected to a gate of the transmission transistor Ttrs22 of the second pixel P22.

It is possible to individually drive the transmission control lines Ltrg1, Ltrg2, Ltrg3, and Ltrg4 by the vertical driving unit 40, and it is possible to individually control the charge output of each unit pixel from the photodiode by the floating diffusion FD.

Meanwhile, the FD sharing pixel unit U is provided with one floating diffusion FD, one reset transistor Tres, one amplification transistor Tamp, and one selection transistor Tse1, in four pixels P11, P12, P21, and P22.

The reset control line Lrst is connected to a gate of the reset transistor Tres, and the selection control line Lse1 is connected to a gate of the selection transistor Tse1.

That is, the resetting of the floating diffusion FD, the amplifying of the voltage accumulated in the floating diffusion, and the outputting of the signal with respect to the vertical signal line VSL are performed commonly with the FD sharing pixel unit U.

The FD sharing pixel circuit described above is an example, and the number of unit pixels and the line of unit pixels may be appropriately changed. For example, the number of unit pixels sharing the FD may be nine pixels of 3×3, and may be 64 pixels of 8×8. The unit pixels sharing the FD may has a configuration of sharing the FD with respect to four pixels of 1×4, that is, four pixels longitudinally arranged in a line, and may have a configuration of sharing the FD with respect to four pixels of 4×1, that is, four pixels transversely arranged in a line.

(2) First Embodiment of Pixel Addition

Next, a first embodiment of pixel addition will be described. In the first embodiment, a color filter array including white is employed, and the cross-correction type is employed in the column processing unit.

FIG. 13 is a diagram illustrating configurations of a color filter array and a column processing unit according to the first embodiment. The color filter array shown in FIG. 13 shows 16 pixels of 4×4 for brief description.

In the color filter array shown in FIG. 13, W (white) filters with the highest output level are disposed in a checkerboard shape, R (red) and B (blue) filters are arranged in a checkerboard shape at a pitch of two pixels vertically and horizontally, the R and B filters are arranged to obliquely deviate at pitch of one pixel, and the remaining pixels are G (green) filters. In this case, the G filters are arranged in an oblique stripe shape.

Specifically, the W filters are disposed at the checkerboard shape, the R filters are disposed at the fourth of the second line and at the second of the fourth line, and the B filters are disposed at the third of the first line and at the first of the third line. The arrangement of the R filters and the B filters is the checkerboard arrangement at the pitch of two pixels.

The G filters are disposed at the other pixel positions. Of course, the color arrangement of the color filter array including the white is not limited thereto, and various kinds of color arrangement may be employed.

In the pixel array, four pixels of the vertical and horizontal 2×2 constitute the FD sharing pixel unit.

Specifically, the upper left four pixels (G1, G2, W1, and W2) constitute one FD sharing pixel unit, and the lower left four pixels (B2, R2, W5, and W6) constitute one FD sharing pixel unit. The FD sharing pixel units are connected to the vertical signal line VSL1 through each sharing FD.

The upper right four pixels (B1, R1, W3, and W4) constitute one FD sharing pixel unit, and the lower right four pixels (G3, G4, W7, and W8) constitute one FD sharing pixel unit. The FD sharing pixel units are connected to the vertical signal line VSL2 through each sharing FD.

The pixel signal output through the vertical signal line VSL1 is input to the comparator 721. The comparator 721 determines magnitude between the reference signal input from the DAC 80 and the pixel signal. For example, when a gradually increased ramp wave is used as the reference signal, the comparator 721 outputs Low when the reference signal is lower than the pixel signal, and outputs High when the reference signal is equal to or higher than the pixel signal.

Meanwhile, the pixel signal output through the vertical signal line VSL2 is input to the comparator 722. The comparator 722 determines magnitude between the reference signal input from the DAC 80 and the pixel signal. For example, when a gradually increased ramp wave is used as the reference signal, the comparator 722 outputs Low when the reference signal is lower than the pixel signal, and outputs High when the reference signal is equal to or higher than the pixel signal.

The output terminal of the comparator 721 is connected to the counter 731 provided corresponding to the vertical signal line VSL1 through the switch SWa11, and is connected to the counter 732 provided corresponding to the vertical signal line VSL2 through the switch SWa12. The vertical signal line VSL2 is a vertical signal line disposed adjacent to the vertical signal line VSL1.

The output terminal of the comparator 722 is connected to the counter 732 provided corresponding to the vertical signal line VSL2 through the switch SWa22, and is connected to the counter 731 provided corresponding to the vertical signal line VSL1 through the switch SWa21. The vertical signal line VSL1 is a vertical signal line disposed adjacent to the vertical signal line VSL2.

The ON/OFF of The switches SWa11, SWa12, SWa22, and SWa21 is controlled by the SW control signal output through the SW control line by the timing control unit 60. The switches are turned on or off to satisfy the relationship shown in FIG. 3 described above.

FIG. 14 is a timing chart according to an addition operation of the first embodiment.

First, an addition operation of white pixels that are the main component of brightness will be described. To perform the addition of the white pixels, the switches SWa11 and SWa22 are turned on, and the switches SWa12 and SWa21 are turned off.

The pixel W1 and the pixel W3 are selected, the pixel signal of the pixel W1 is output to the vertical signal line VSL1, and the pixel signal of the pixel W3 is output to the vertical signal line VSL2. Then, the pixel W2 and the pixel W4 are selected, the pixel signal of the pixel W2 is output to the vertical signal line VSL1, and the pixel signal of the pixel W4 is output to the vertical signal line VSL2.

That is, the pixel signals of the pixels W1 and W2 are sequentially output to the vertical signal line VSL1, and the pixel signals of the pixels W3 and W4 are sequentially output to the vertical signal line VSL2.

Since the switches SWa11 and SWa22 are turned on and the switches SWa12 and SWa21 are turned off, both pixel signals of the pixels W1 and W2 are counted by the counter 731, and both pixel signals of the pixels W3 and W4 are counted by the counter 732.

The counter 731 continues the counting by the control of the timing control unit 60 without initializing the count until the counting of both pixel signals of the pixels W1 and W2 is completed. Accordingly, the count value of the counter 731 is digital data corresponding to the summing of the pixel signals of the pixels W1 and W2.

Similarly, the counter 732 continues the counting by the control of the timing control unit 60 without initializing the count until the counting of both pixel signals of the pixels W3 and W4 is completed. Accordingly, the count value of the counter 732 is digital data corresponding to the summing of the pixel signals of the pixels W3 and W4.

In other words, the timing control unit 60 does not initialize the count values by the counters 731 and 732 until the counting of two pixels as the addition target, and initializes the count values of the counters 731 and 732 when the counting of two pixels as the addition target is completed and the count values are output to the memories 741 and 742 (see FIG. 2).

When the counting of the pixel signals of two pixels is completed, the counters 731 and 732 outputs the count values to the memories 741 and 742 by the control of the timing control unit 60.

As a result, the digital data formed by summing up the pixels W1 and W2 and the digital data formed by summing up the pixels W3 and W4 are stored in the memories 741 and 742, respectively. The digital data stored in the memories 741 and 742 are output to the output circuit 90 through the horizontal signal lines, during the addition process performed thereafter by the control of the timing control unit 60.

By performing the same addition operation on the pixels W5, W6, W7, and W8 that are the other white pixels, the digital data formed by summing up the pixels W5 and W6 and the digital data formed by summing up the pixels W7 and W8 are stored in the memories 741 and 742, and the digital data are output to the output circuit 90 through the horizontal signal lines during the addition process performed thereafter by the control of the timing control unit 60.

Next, the addition operation of the R, G, and B pixels will be described. In the embodiment, the addition operation of the white pixels is first performed, and the addition operation of the RGB pixels is performed thereafter. However, of course, the sequence may be reverse and alternate, and the sequence may be appropriately changed.

To add the R, G, and B pixels, first, the switches SWa11 and the SWa22 are turned off, and the switches Swa12 and SWa21 are turned on. The pixel G1 and the pixel B1 are selected, the pixel signal of the pixel G1 is output to the vertical signal line VSL1, and the pixel signal of the pixel B1 is output to the vertical signal line VSL2.

Since the switches SWa11 and the SWa22 are turned off and the switches SWa12 and SWa21 are turned on, the pixel signal of the pixel G1 output through the vertical signal line VSL1 is counted by the counter 732 provided corresponding to the adjacent vertical signal line VSL2, and the pixel signal of the pixel B1 output through the vertical signal line VSL2 is counted by the counter 731 provided corresponding to the adjacent vertical signal line VSL1.

Then, the switches SWa11 and SWa22 are turned on, and the switches SWa12 and SWa21 are turned off. The pixel B2 and the pixel G3 are selected, the pixel signal of the pixel B2 is output to the vertical signal line VSL1, and the pixel signal of the pixel G3 is output to the vertical signal line VSL2.

Since the switches SWa11 and the SWa22 are turned on and the switches SWa12 and SWa21 are turned off, the pixel signal of the pixel B2 output through the vertical signal line VSL1 is counted by the counter 731, and the pixel signal of the pixel G3 output through the vertical signal line VSL2 is counted by the counter 732.

Similarly to the counting of white, since the counter 731 continues the counting by the control of the control unit 60 until the counting of two pixels of the pixels B1 and B2, the count value of the counter 731 is digital data corresponding to the sum of the pixel signals of the pixels B1 and B2.

Similarly, since the counter 732 also continues the counting by the control of the control unit 60 until the counting of two pixels of the pixels G1 and G3, the count value of the counter 732 is digital data corresponding to the sum of the pixel signals of the pixels G1 and G3.

The counters 731 and 732 outputs the count values to the memories 741 and 742 by the control of the timing control unit 60, respectively, when the counting of the pixel signals of two pixels is completed.

That is, the timing control unit 60 does not initialize the count values in the counters 731 and 732 until the counting of two pixels is completed, and initializes the count values of the counters 731 and 732 when the counting of two pixels.

As a result, the digital data formed by summing up the pixels B1 and B2 and the digital data formed by summing up the pixels G1 and G3 are stored in the memories 741 and 742, respectively. The digital data stored in the memories 741 and 742 are output to the output circuit 90 through the horizontal signal line during the addition process performed thereafter by the control of the timing control unit 60.

By performing the same addition operation on the pixels R1, R2, G2, and G4, the digital data formed by summing up the pixels R1 and R2 and the digital data formed by summing up the pixels G2 and G4 are stored in the memories 741 and 742, and are output to the output circuit 90 through the horizontal signal line during the addition process performed thereafter by the control of the timing control unit 60.

Figure 15A:
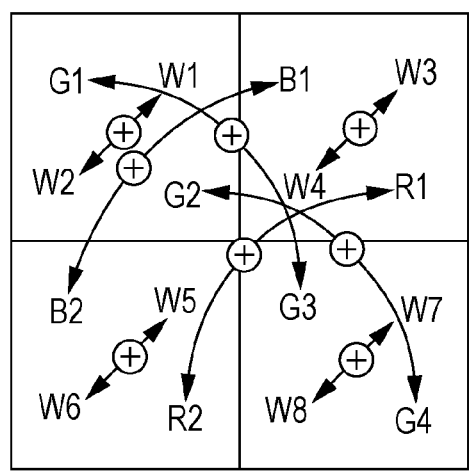
FIG. 15A and FIG. 15B are diagrams illustrating a reading image in the addition operation described with reference to FIG. 13 and FIG. 14.
Figure 15B:
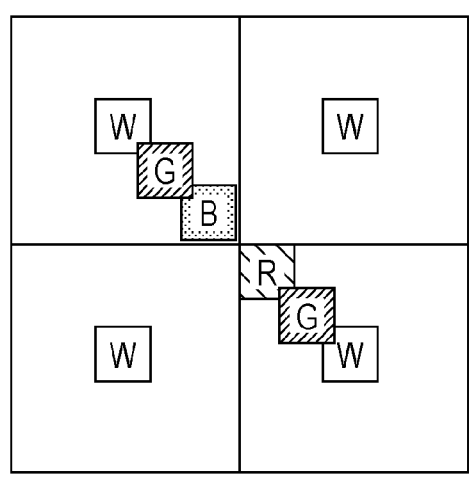

FIG. 15A and FIG. 15B are diagrams illustrating a reading image in the addition operation described with reference to FIG. 13 and FIG. 14. As shown in FIG. 15A, by performing the addition operation described above, with respect to the white pixel, digital data formed by adding a white pixel adjacent in an oblique direction is acquired, and with respect to RGB pixels, digital data formed by adding the same color of pixels deviate in an oblique direction by two pixels are acquired.

However, as shown in FIG. 15B, the addition value of the white pixel obtained by the addition operation of the timing chart shown in FIG. 14 corresponds to the pixel value at the center of the FD sharing pixel unit, but the addition value of the RGB pixels corresponds to the pixel value at a position deviating from the center of the FD sharing pixel unit.

When the addition operation is performed, it is possible to adjust the finally obtained addition value of the pixel to be close to the pixel value at the center of the FD sharing pixel unit by adjusting a gain in the A/D conversion.

Figure 16:
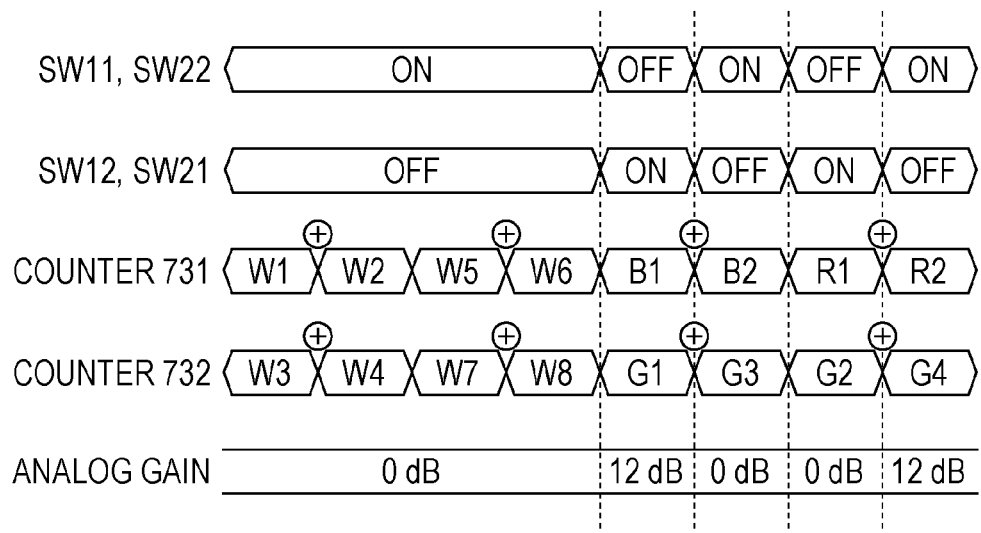
FIG. 16 is a timing chart illustrating the addition operation of the first embodiment performed while adjusting the gain.

FIG. 16 is a timing chart illustrating an addition operation of the first embodiment performed while adjusting the gain. The gain adjustment may be realized, for example, by adjusting the slope of the reference signal generated by the reference signal generating unit 80 as described above. That is, to raise the gain, it is preferable to decrease the slope of the reference signal, and to lower the gain, it is preferable to increase the slope of the reference signal.

As shown in FIG. 16, the gain is 12 dB at the time of reading the pixels B1, G1, R2, and G4, and the gain is 0 dB at the time of reading the pixels W1 to W8 and the pixels B2, G3, R1, and G2. That is, by increasing one gain of two pixels added in FIG. 15 more than the other gain, the position corresponding to the addition value is adjusted to approach the pixel position of the higher gain side. The gain value described herein is an example, and it is obvious that it is arbitrarily adjusted.

Figure 17:
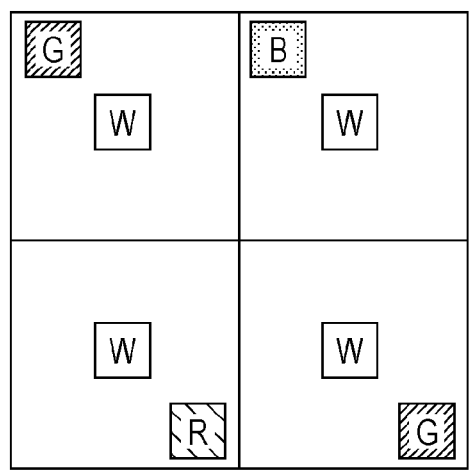
FIG. 17 is a diagram illustrating a reading image obtained as a result of the gain adjustment shown in FIG. 16.

FIG. 17 is a diagram illustrating a reading image obtained as a result of the gain adjustment shown in FIG. 16.

As shown in FIG. 17, the position corresponding to the addition value of the pixel B1 and the pixel B2 is close to the pixel position of the pixel B1 by increasing the gain of the pixel B1 higher than that of the pixel B2, the position corresponding to the addition value of the pixel G1 and the pixel G3 is close to the pixel position of the pixel G1 by increasing the gain of the pixel G1 higher than that of the pixel G3, the position corresponding to the addition value of the pixel R1 and the pixel R2 is close to the pixel position of the pixel R2 by increasing the gain of the pixel R2 higher than that of the pixel R1, and the position corresponding to the addition value of the pixel G2 and the pixel G4 is close to the pixel position of the pixel G4 by increasing the gain of the pixel G4 higher than that of the pixel G2.

Since the positions of the white pixels W1 to W8 corresponding to the addition value originally correspond to the center of each pixel unit, it is not necessary to adjust the gain in the first embodiment, and the white pixels W1 to W8 correspond to the same position shown in FIG. 15B.

(3) Second Embodiment of Pixel Addition

Next, a second embodiment of pixel addition will be described. In the second embodiment, a color filter array including white is employed, and the shift-correction type is employed in the column processing unit.

Figure 18:
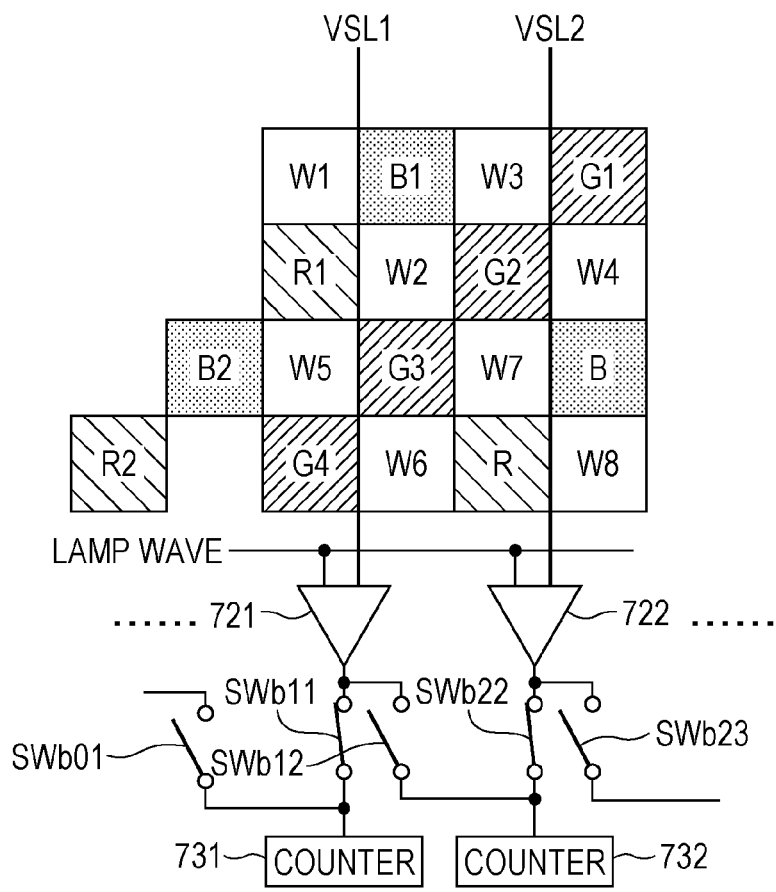
FIG. 18 is a diagram illustrating configurations of a color filter array and a column processing unit according to the second embodiment.

FIG. 18 is a diagram illustrating configurations of a color filter array and a column processing unit according to the second embodiment. Similarly to the first embodiment, in the color filter array as shown in FIG. 18, 16 pixels of 4×4 are shown, W filters with the highest output level are disposed in a checkerboard shape, R and B filters are arranged in a checkerboard shape at a pitch of two pixels vertically and horizontally, the R and B filters are arranged to obliquely deviate at pitch of one pixel, and the remaining pixels are G filters.

In the pixel array, four pixels of the vertical and horizontal 2×2 constitute the FD sharing pixel unit.

Specifically, the upper left four pixels (B1, R1, W1, and W2) constitute one FD sharing pixel unit, and the lower left four pixels (G3, G4, W5, and W6) constitute one FD sharing pixel unit. The FD sharing pixel units are connected to the vertical signal line VSL1 through each sharing FD.

The upper right four pixels (G1, G2, W3, and W4) constitute one FD sharing pixel unit, and the lower right four pixels (B, R, W7, and W8) constitute one FD sharing pixel unit. The FD sharing pixel units are connected to the vertical signal line VSL2 through each sharing FD.

Two pixels (B2 and R2) shown at the lower left portion are pixels connected to the vertical signal line VSL0 (not shown) adjacent to the left side of the vertical signal line VSL1, and is counted by the counter 731 when the switch SWb01 is turned on.

The pixel signal output through the vertical signal line VSL0 (not shown) is input to a comparator 720 (not shown) provided corresponding to the vertical signal line VSL0. The comparator 720 determines magnitude between the reference signal input from the DAC 80 and the pixel signal. For example, when a gradually increased ramp wave is used as the reference signal, the comparator 720 outputs Low when the reference signal is lower than the pixel signal, and outputs High when the reference signal is equal to or higher than the pixel signal.

The pixel signal output through the vertical signal line VSL1 is input to the comparator 721. The comparator 721 determines magnitude between the reference signal input from the DAC 80 and the pixel signal. For example, when a gradually increased ramp wave is used as the reference signal, the comparator 721 outputs Low when the reference signal is lower than the pixel signal, and outputs High when the reference signal is equal to or higher than the pixel signal.

The pixel signal output through the vertical signal line VSL2 is input to the comparator 722. The comparator 722 determines magnitude between the reference signal input from the DAC 80 and the pixel signal. For example, when a gradually increased ramp wave is used as the reference signal, the comparator 722 outputs Low when the reference signal is lower than the pixel signal, and outputs High when the reference signal is equal to or higher than the pixel signal.

The output terminal of the comparator 720 (not shown) is connected to the counter 731 provided corresponding to the vertical signal line VSL1 through SWb01.

The output terminal of the comparator 721 is connected to the counter 731 provided corresponding to the vertical signal line VSL1 through the switch SWb11, and is connected to the counter 732 provided corresponding to the vertical signal line VSL2 through the switch SWb12. The vertical signal line VSL2 is a vertical signal line disposed adjacent to the right side of the vertical signal line VSL1.

The output terminal of the comparator 722 is connected to the counter 732 provided corresponding to the vertical signal line VSL2 through the switch SWb22, and is connected to the counter 733 provided corresponding to the vertical signal line VSL3 (not shown) through the switch SWb23. The vertical signal line VSL3 is a vertical signal line disposed adjacent to the right side of the vertical signal line VSL2.

The ON/OFF of The switches SWb01, SWb11, SWb12, SWb22, and SWb23 is controlled by the SW control signal output through the SW control line by the timing control unit 60. The switches are turned on or off to satisfy the relationship shown in FIG. 7 described above.

Figure 19:
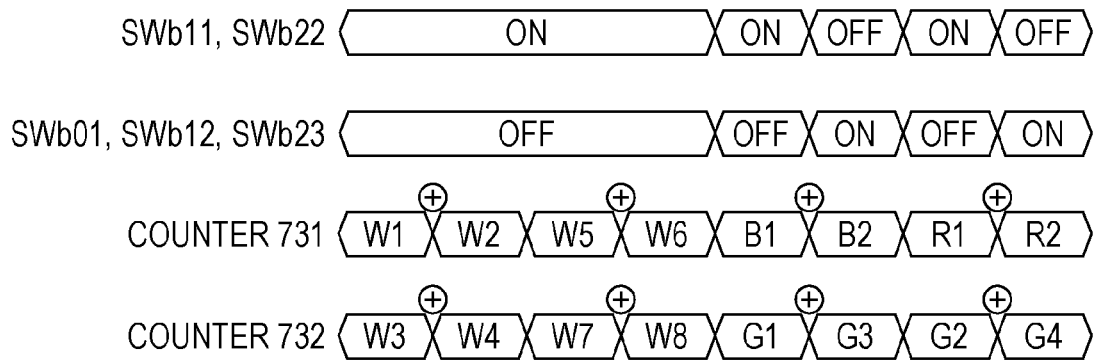
FIG. 19 is a timing chart according to an addition operation of the second embodiment.

FIG. 19 is a timing chart according to an addition operation of the second embodiment.

First, an addition operation of white pixels that are the main component of brightness will be described. To perform the addition of the white pixels, the switches SWb11 and SWb22 are turned on, and the switches SWb12 and SWb23 are turned off.

The pixel W1 and the pixel W3 are selected, the pixel signal of the pixel W1 is output to the vertical signal line VSL1, and the pixel signal of the pixel W3 is output to the vertical signal line VSL2. Then, the pixel W2 and the pixel W4 are selected, the pixel signal of the pixel W2 is output to the vertical signal line VSL1, and the pixel signal of the pixel W4 is output to the vertical signal line VSL2.

That is, the pixel signals of the pixels W1 and W2 are sequentially output to the vertical signal line VSL1, and the pixel signals of the pixels W3 and W4 are sequentially output to the vertical signal line VSL2.

Since the switches SWb11 and SWb22 are turned on and the switches SWb12 and SWb23 are turned off, both pixel signals of the pixels W1 and W2 are counted by the counter 731, and both pixel signals of the pixels W3 and W4 are counted by the counter 732.

The counter 731 continues the counting by the control of the timing control unit 60 without initializing the count until the counting of both pixel signals of the pixels W1 and W2 is completed. Accordingly, the count value of the counter 731 is digital data corresponding to the summing of the pixel signals of the pixels W1 and W2.

Similarly, the counter 732 continues the counting by the control of the timing control unit 60 without initializing the count until the counting of both pixel signals of the pixels W3 and W4 is completed. Accordingly, the count value of the counter 732 is digital data corresponding to the summing of the pixel signals of the pixels W3 and W4.

In other words, the timing control unit 60 does not initialize the count values by the counters 731 and 732 until the counting of two pixels as the addition target, and initializes the count values of the counters 731 and 732 when the counting of two pixels as the addition target is completed and the count values are output to the memories 741 and 742 (see FIG. 2).

When the counting of the pixel signals of two pixels is completed, the counters 731 and 732 outputs the count values to the memories 741 and 742 by the control of the timing control unit 60.

As a result, the digital data formed by summing up the pixels W1 and W2 and the digital data formed by summing up the pixels W3 and W4 are stored in the memories 741 and 742, respectively. The digital data stored in the memories 741 and 742 are output to the output circuit 90 through the horizontal signal lines, during the addition process performed thereafter by the control of the timing control unit 60.

By performing the same addition operation on the pixels W5, W6, W7, and W8 that are the other white pixels, the digital data formed by summing up the pixels W5 and W6 and the digital data formed by summing up the pixels W7 and W8 are stored in the memories 741 and 742, and the digital data are output to the output circuit 90 through the horizontal signal lines during the addition process performed thereafter by the control of the timing control unit 60.

Next, the addition operation of the R, G, and B pixels will be described. In the second embodiment, the addition operation of the white pixels is first performed, and the addition operation of the RGB pixels is performed thereafter. However, of course, the sequence may be reverse and alternate, and the sequence may be appropriately changed.

To add the R, G, and B pixels, first, the switches SWb11 and the SWb22 are turned on and the switches Swb12 and Swab23 (and the switch SWb01) are turned off. The pixel B1 and the pixel G1 are selected, the pixel signal of the pixel B1 is output to the vertical signal line VSL1, and the pixel signal of the pixel G1 is output to the vertical signal line VSL2.

Since the switches SWb11 and the SWb22 are turned on and the switches SWb12 and SWb23 are turned off, the pixel signal of the pixel B1 output through the vertical signal line VSL1 is counted by the counter 731 provided corresponding to the vertical signal line VSL1, and the pixel signal of the pixel G1 output through the vertical signal line VSL2 is counted by the counter 732 provided corresponding to the vertical signal line VSL2.

Then, the switches SWb11 and SWb22 are turned off, and the switches SWb12 and SWb23 (and the switch SWb01) are turned on. The pixel B2 and the pixel G3 are selected, the pixel signal of the pixel B2 is output to the vertical signal line VSL0 (not shown), and the pixel signal of the pixel G3 is output to the vertical signal line VSL1.

Since the switches SWb11 and the SWb22 are turned off and the switches SWb12 and SWb23 (and the switch SWb01) are turned on, the pixel signal of the pixel B2 output through the vertical signal line VSL0 (not shown) is counted by the counter 731, and the pixel signal of the pixel G3 output through the vertical signal line VSL1 is counted by the counter 732.

Similarly to the counting of white, since the counter 731 continues the counting by the control of the control unit 60 until the counting of two pixels of the pixels B1 and B2, the count value of the counter 731 is digital data corresponding to the sum of the pixel signals of the pixels B1 and B2.

Similarly, since the counter 732 also continues the counting by the control of the control unit 60 until the counting of two pixels of the pixels G1 and G3, the count value of the counter 732 is digital data corresponding to the sum of the pixel signals of the pixels G1 and G3.

The counters 731 and 732 outputs the count values to the memories 741 and 742 by the control of the timing control unit 60, respectively, when the counting of the pixel signals of two pixels is completed.

That is, the timing control unit 60 does not initialize the count values in the counters 731 and 732 until the counting of two pixels is completed, and initializes the count values of the counters 731 and 732 when the counting of two pixels.

As a result, the digital data formed by summing up the pixels B1 and B2 and the digital data formed by summing up the pixels G1 and G3 are stored in the memories 741 and 742, respectively. The digital data stored in the memories 741 and 742 are output to the output circuit 90 through the horizontal signal line during the addition process performed thereafter by the control of the timing control unit 60.

By performing the same addition operation on the pixels R1, R2, G2, and G4, the digital data formed by summing up the pixels R1 and R2 and the digital data formed by summing up the pixels G2 and G4 are stored in the memories 741 and 742, and are output to the output circuit 90 through the horizontal signal line during the addition process performed thereafter by the control of the timing control unit 60.

Figure 20A:
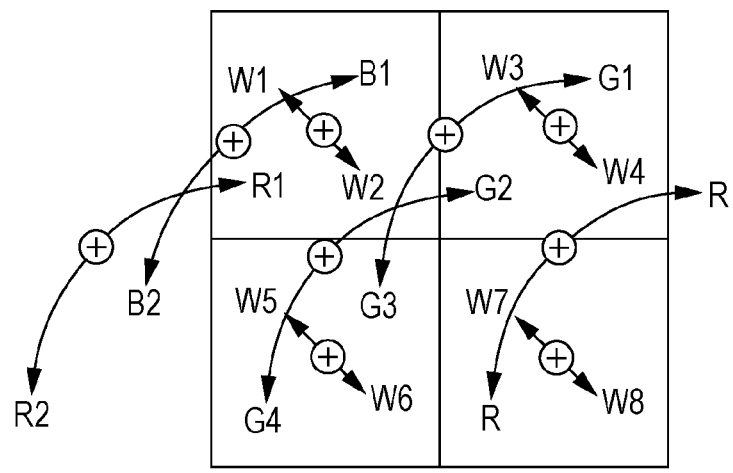
FIG. 20A and FIG. 20B are diagrams illustrating a reading image in the addition operation described with reference to FIG. 18 and FIG. 19.
Figure 20B:
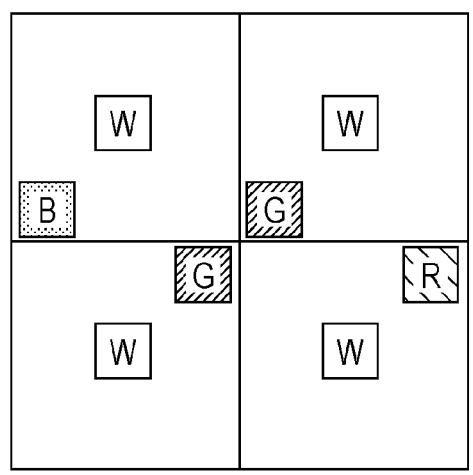

FIG. 20A and FIG. 20B are diagrams illustrating a reading image in the addition operation described with reference to FIG. 18 and FIG. 19. As shown in FIG. 20A, by performing the addition operation described above, with respect to the white pixel, digital data formed by adding a white pixel adjacent in an oblique direction is acquired, and with respect to RGB pixels, digital data formed by adding the same color of pixels deviate in an oblique direction by two pixels are acquired.

However, as shown in FIG. 20B, the addition value of the white pixel obtained by the addition operation of the timing chart shown in FIG. 19 corresponds to the pixel value at the center of the FD sharing pixel unit, but the addition value of the RGB pixels corresponds to the pixel value at a position deviating from the center of the FD sharing pixel unit.

When the addition operation is performed, it is possible to adjust the finally obtained addition value of the pixel to be close to the pixel value at the center of the FD sharing pixel unit by adjusting a gain in the A/D conversion.

Figure 21:
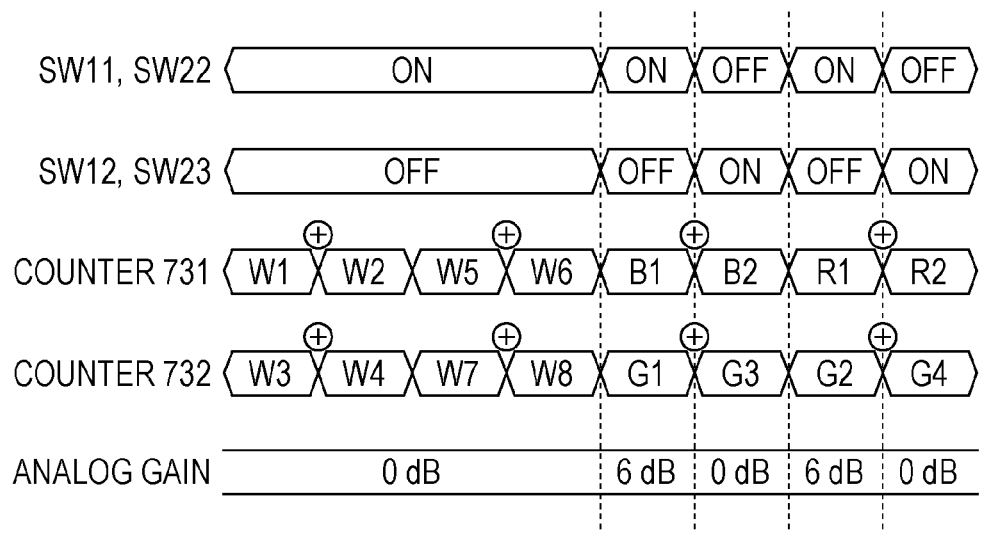
FIG. 21 is a timing chart illustrating the addition operation of the second embodiment performed while adjusting the gain.

FIG. 21 is a timing chart illustrating an addition operation of the second embodiment performed while adjusting the gain.

As shown in FIG. 21, the gain is 6 dB at the time of reading the pixels B1, G1, R1, and G2, and the gain is 0 dB at the time of reading the pixels W1 to W8 and the pixels B2, G3, R2, and G4. That is, by increasing one gain of two pixels added in FIG. 20 more than the other gain, the position corresponding to the addition value is adjusted to approach the pixel position of the higher gain side.

More specifically, to adjust the addition value of the pixel to correspond to the center of the FD sharing pixel unit, the gain of the pixels B1, G1, R1, and G2 is 6.64 dB when the gain of the pixels B2, G3, R2, and G4 is 0 dB such that a ratio of the gain of the pixels B1, G1, R1, and G2 and the gain of the pixels B2, G3, R2, and G4 is 3:1.

Figure 22:
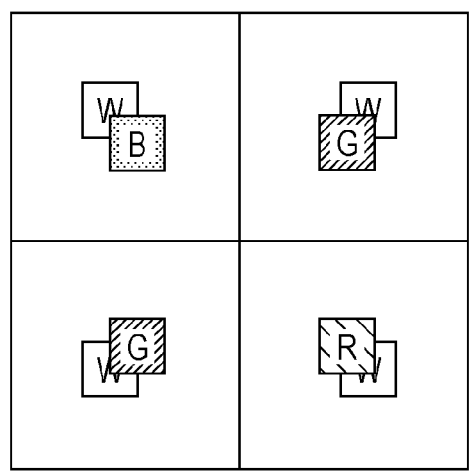
FIG. 22 is a diagram illustrating a reading image obtained as a result of the gain adjustment shown in FIG. 21.

FIG. 22 is a diagram illustrating a reading image obtained as a result of the gain adjustment shown in FIG. 21.

As shown in FIG. 22, the position corresponding to the addition value of the pixel B1 and the pixel B2 is close to the pixel position of the pixel B1 by increasing the gain of the pixel B1 higher than that of the pixel B2, the position corresponding to the addition value of the pixel G1 and the pixel G3 is close to the pixel position of the pixel G1 by increasing the gain of the pixel G1 higher than that of the pixel G3, the position corresponding to the addition value of the pixel R1 and the pixel R2 is close to the pixel position of the pixel R2 by increasing the gain of the pixel R2 higher than that of the pixel R1, and the position corresponding to the addition value of the pixel G2 and the pixel G4 is close to the pixel position of the pixel G4 by increasing the gain of the pixel G4 higher than that of the pixel G2, Since the positions of the white pixels W1 to W8 corresponding to the addition value originally correspond to the center of each pixel unit, the gain is not performed in the second embodiment, and the white pixels W1 to W8 correspond to the same position shown in FIG. 20B.

(4) Third Embodiment of Pixel Addition

Next, a third embodiment of pixel addition will be described. In the third embodiment, a color filter array of Bayer arrangement in the related art, and the cross-connection type described is employed in the column processing unit.

Figure 23:
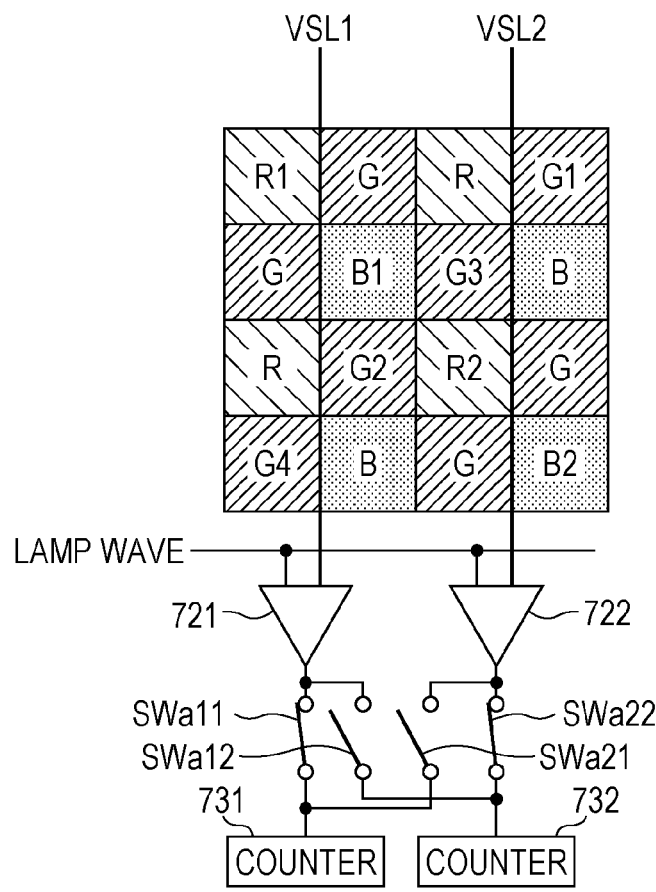
FIG. 23 is a diagram illustrating configurations of a color filter array and a column processing unit according to a third embodiment.

FIG. 23 is a diagram illustrating configurations of a color filter array and a column processing unit according to the third embodiment. The color filter array shown in FIG. 13 shows 16 pixels of 4×4 similarly to the first embodiment. In the pixel array, four pixels of the vertical and horizontal 2×2 constitute the FD sharing pixel unit.

Specifically, the upper left four pixels (R1, B1, G, and G) constitute one FD sharing pixel unit, and the lower left four pixels (G2, G4, R, and B) constitute one FD sharing pixel unit. The FD sharing pixel units are connected to the vertical signal line VSL1 through each sharing FD.

The upper right four pixels (R, B, G1, and G3) constitute one FD sharing pixel unit, and the lower right four pixels (R2, B2, G, and G) constitute one FD sharing pixel unit. The FD sharing pixel units are connected to the vertical signal line VSL2 through each sharing FD.

The pixel signal output through the vertical signal line VSL1 is input to the comparator 721. The comparator 721 determines magnitude between the reference signal input from the DAC 80 and the pixel signal. For example, when a gradually increased ramp wave is used as the reference signal, the comparator 721 outputs Low when the reference signal is lower than the pixel signal, and outputs High when the reference signal is equal to or higher than the pixel signal.

Meanwhile, the pixel signal output through the vertical signal line VSL2 is input to the comparator 722. The comparator 722 determines magnitude between the reference signal input from the DAC 80 and the pixel signal. For example, when a gradually increased ramp wave is used as the reference signal, the comparator 722 outputs Low when the reference signal is lower than the pixel signal, and outputs High when the reference signal is equal to or higher than the pixel signal.

The output terminal of the comparator 721 is connected to the counter 731 provided corresponding to the vertical signal line VSL1 through the switch SWa11, and is connected to the counter 732 provided corresponding to the vertical signal line VSL2 through the switch SWa12. The vertical signal line VSL2 is a vertical signal line disposed adjacent to the vertical signal line VSL1.

The output terminal of the comparator 722 is connected to the counter 732 provided corresponding to the vertical signal line VSL2 through the switch SWa22, and is connected to the counter 731 provided corresponding to the vertical signal line VSL1 through the switch SWa21. The vertical signal line VSL1 is a vertical signal line disposed adjacent to the vertical signal line VSL2.

The ON/OFF of The switches SWa11, SWa12, SWa22, and SWa21 is controlled by the SW control signal output through the SW control line by the timing control unit 60. The switches are turned on or off to satisfy the relationship shown in FIG. 3 described above.

Figure 24:
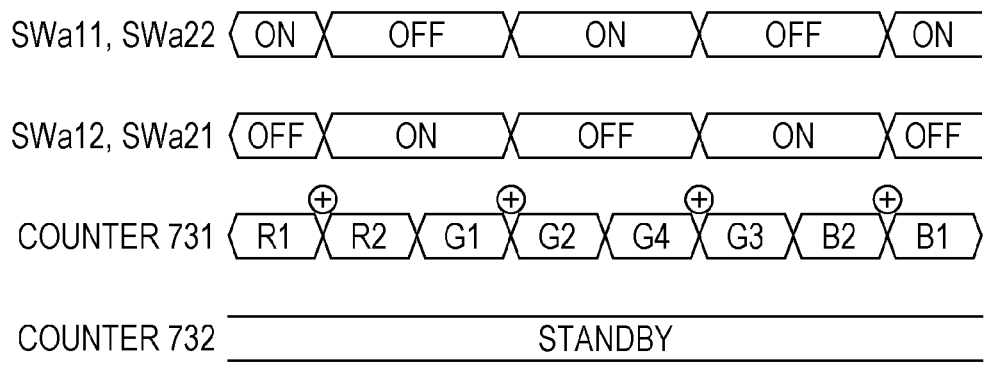
FIG. 24 is a timing chart according to an addition operation of the third embodiment.

FIG. 24 is a timing chart according to an addition operation of the third embodiment.

First, the switches SWa11 and SWa22 are turned on, and the switches SWa12 and SWa21 are turned off. The pixel R1 is selected, and the pixel signal of the pixel R1 is output to the vertical signal line VSL1. Herein, since the switches SWa11 and SWa22 are turned on and the switches SWa12 and SWa21 are turned off, the pixel signal of the pixel R1 is counted by the counter 731.

Then, the switches SWa11 and SWa22 are turned off, and the switches SWa12 and SWa21 are turned on. The pixel R2 is selected, and the pixel signal of the pixel R2 is output to the vertical signal line VSL2. Herein, since the switches SWa11 and SWa22 are turned off and the switches SWa12 and SWa21 are turned on, the pixel signal of the pixel R2 is counted by the counter 731.

The counter 731 continues the counting by the control of the timing control unit 60 without initializing the count until the counting of both pixel signals of the pixels R1 and R2 is completed. Accordingly, the count value of the counter 731 is digital data corresponding to the summing of the pixel signals of the pixels R1 and R2.

Then, the switch stands as it is, the pixel G1 is selected, and the pixel signal of the pixel G1 is output to the vertical signal line VSL2. Then, the pixel signal of the pixel G1 is counted by the counter 731.

Then, the switches SWa11 and SWa22 are turned on, and the switches SWa12 and SWa21 are turned off. The pixel G2 is selected, and the pixel signal of the pixel G2 is output to the vertical signal line VSL1. Then, the pixel signal of the pixel G2 is counted by the counter 731.

As described above, the ON/OFF of the switches and the outputs of the count values are alternately repeated, and thus it is possible to sequentially output the addition values of the pixels to the output circuit 90 with respect to the remaining pixels G4, G3, B2, and B1.

In the third embodiment, the comparator 722, the counter 732, and the memory 742 provided corresponding to the signal line VSL2 are not used, and thus it is possible to reduce power consumption with such a configuration as a standby state.

Figure 25A:
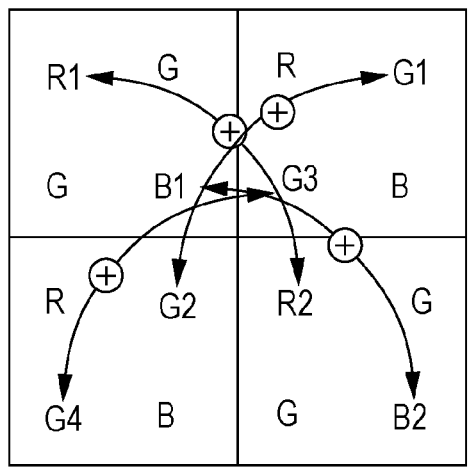
FIG. 25A and FIG. 25B are diagrams illustrating a reading image in the addition operation described with reference to FIG. 23 and FIG. 24.
Figure 25B:
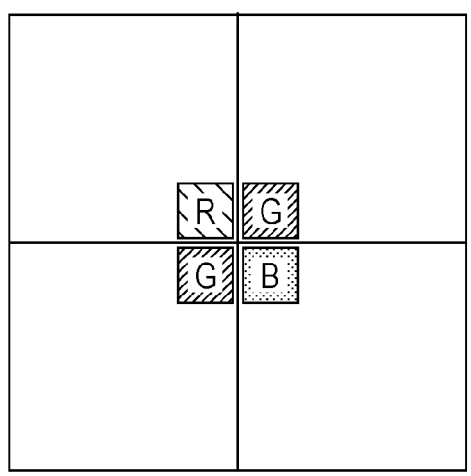

FIG. 25A and FIG. 25B are diagrams illustrating a reading image in the addition operation described with reference to FIG. 23 and FIG. 24. As shown in FIG. 25A, by performing the addition operation described above, with respect to the white pixel, with respect to RGB pixels, digital data formed by adding the same color of pixels deviate in an oblique direction by two pixels are acquired.

However, as shown in FIG. 25B, the addition values of the RGB pixels obtained by the addition operation of the timing chart shown in FIG. 24 corresponds to the pixel value at a position deviating from the center of the FD sharing pixel unit.

When the addition operation is performed, it is possible to adjust the finally obtained addition value of the pixel to be close to the pixel value at the center of the FD sharing pixel unit by adjusting a gain in the A/D conversion.

Figure 26:
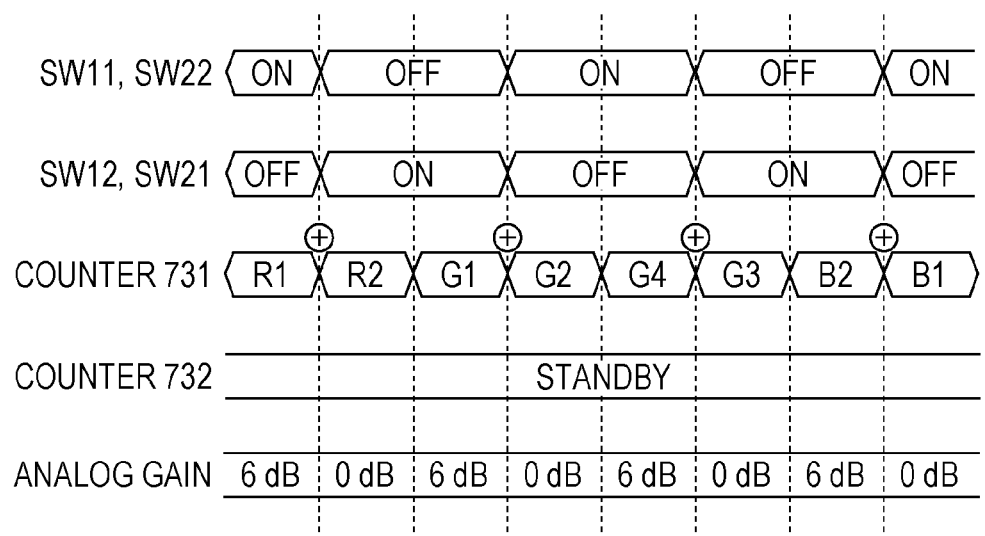
FIG. 26 is a timing chart illustrating the addition operation of the third embodiment performed while adjusting the gain.

FIG. 26 is a timing chart illustrating an addition operation of the third embodiment performed while adjusting the gain.

As shown in FIG. 26, the gain is 6 dB at the time of reading the pixels R1, G1, G4, and B2, and the gain is 0 dB at the time of reading the pixels R2, G2, G3, and B1. That is, by increasing one gain of two pixels added in FIG. 25 more than the other gain, the position corresponding to the addition value is adjusted to approach the pixel position of the higher gain side.

Figure 27:
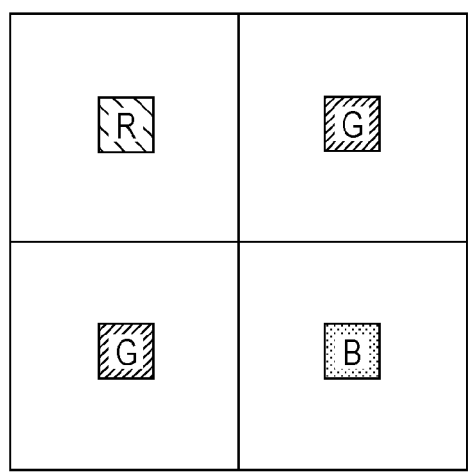
FIG. 27 is a diagram illustrating a reading image obtained as a result of the gain adjustment shown in FIG. 26.

FIG. 27 is a diagram illustrating a reading image obtained as a result of the gain adjustment shown in FIG. 26.

As shown in FIG. 27, the position corresponding to the addition value of the pixel R1 and the pixel R2 is close to the pixel position of the pixel R1 by increasing the gain of the pixel R1 higher than that of the pixel R2, the position corresponding to the addition value of the pixel G1 and the pixel G2 is close to the pixel position of the pixel G1 by increasing the gain of the pixel G1 higher than that of the pixel G2, the position corresponding to the addition value of the pixel G4 and the pixel G3 is close to the pixel position of the pixel G4 by increasing the gain of the pixel G4 higher than that of the pixel G3, and the position corresponding to the addition value of the pixel B2 and the pixel B1 is close to the pixel position of the pixel B2 by increasing the gain of the pixel B2 higher than that of the pixel B1.

(5) VARIOUS MODIFICATION EXAMPLES

(5-1) First Modification Example

In the embodiments, the FD addition method may be used together.

That is, a plurality of pixels are selected from the FD sharing pixel unit, charges are output from photodiodes of the plurality of pixels to the floating diffusion, and the pixel value is analog-added in advance to the floating diffusion FD and is output to the vertical signal line.

For example, in the first embodiment and the second embodiment, when two white pixels belonging to one FD sharing pixel unit are subjected to FD addition and are output, it is possible to reduce a process time taking in the outputting of the white pixels by half.

(5-2) Second Modification Example

In the embodiments and modification examples described above, the case of performing the decimation outputting of 16 pixels of vertical and horizontal 4×4 into four pixels of vertical and horizontal 2×2 has been described, but it is obvious that the disclosure may correspond various decimation degrees, for example, the decimation outputting of 64 pixels of vertical and horizontal 8×8 into four pixels of vertical and horizontal 2×2.

(5-3) Third Modification Example

In the embodiments and modification examples described above, the comparator and counter corresponding to each vertical signal line are connected to the first switch, and the comparator corresponding to each vertical signal line and the counter corresponding to the adjacent vertical signal are connected to the second switch. However, the disclosure is not limited to the case where the counter that is the connection destination of the second switch does not necessarily correspond to the vertical signal line.

Figure 28:
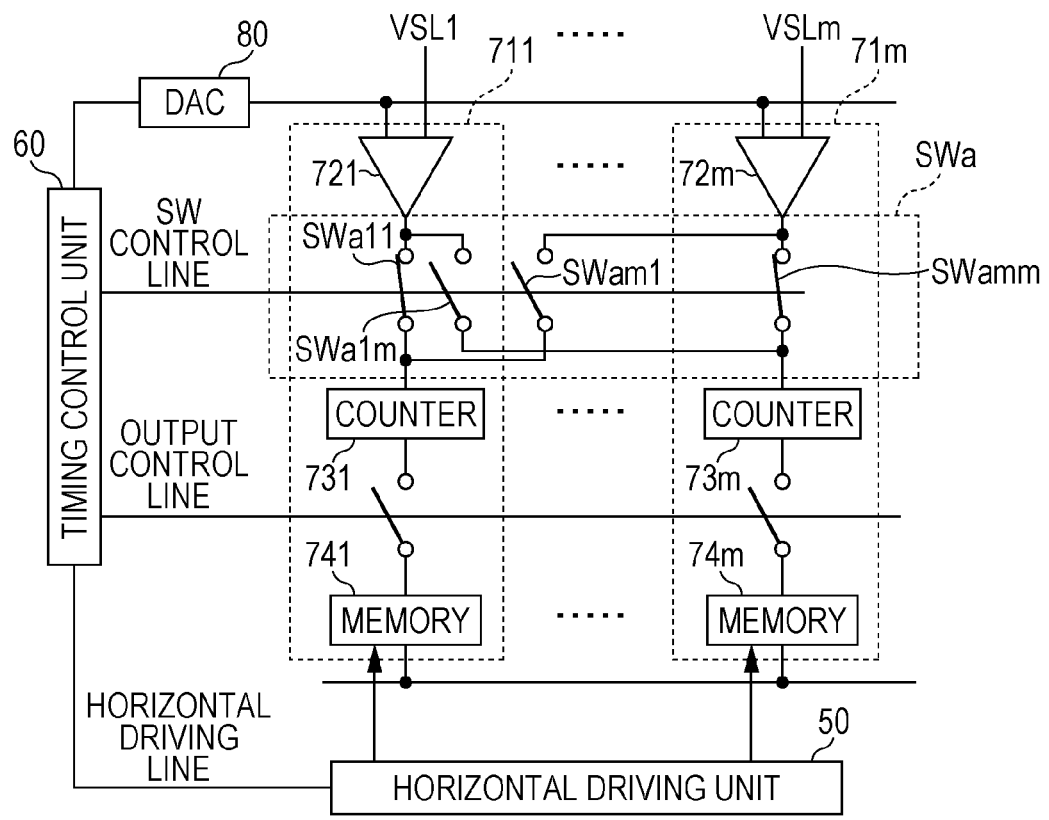
FIG. 28 is a diagram illustrating a relationship of connection according to a third modification example.
Figure 29:
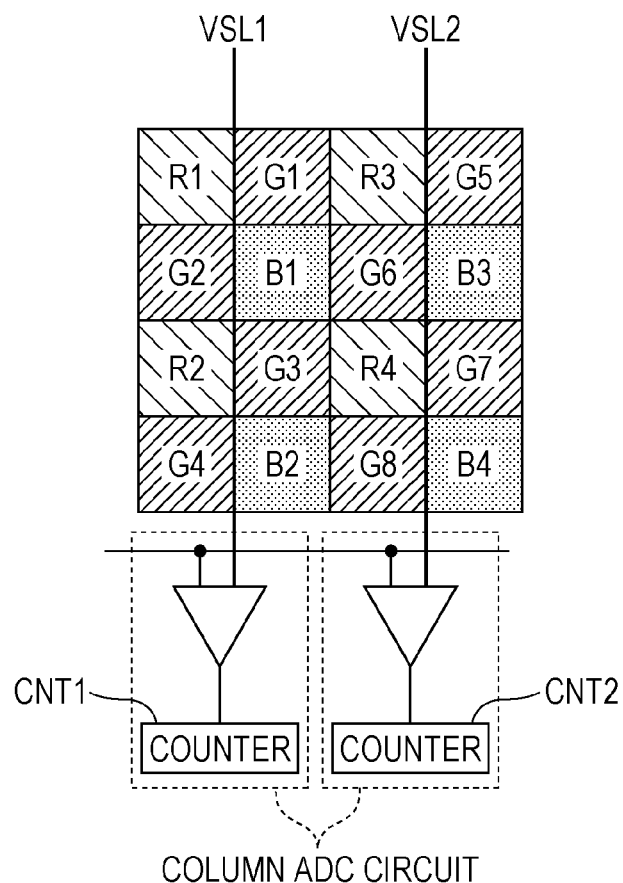
FIG. 29 is a diagram illustrating an example of pixel addition performed using the column ADC circuit when a Bayer arrangement is used as a color filter array.
Figure 30:
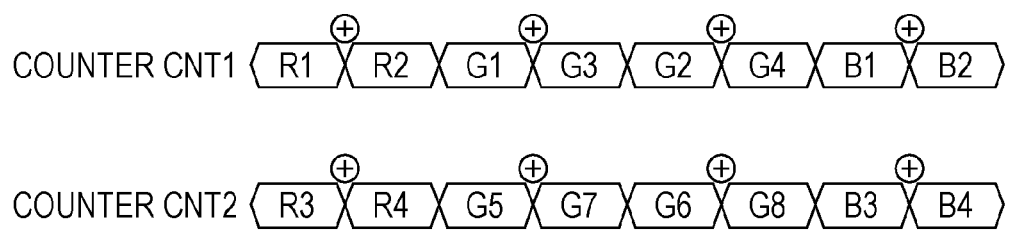
FIG. 30 is a timing chart at the time of circuit addition in the column ADC circuit shown in FIG. 31A and FIG. 31B.
Figure 31A:
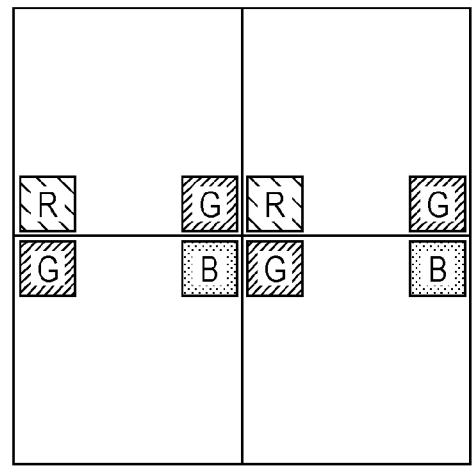
FIG. 31A and FIG. 31B are reading images when the column ADC circuit shown in FIG. 31A
Figure 31B:
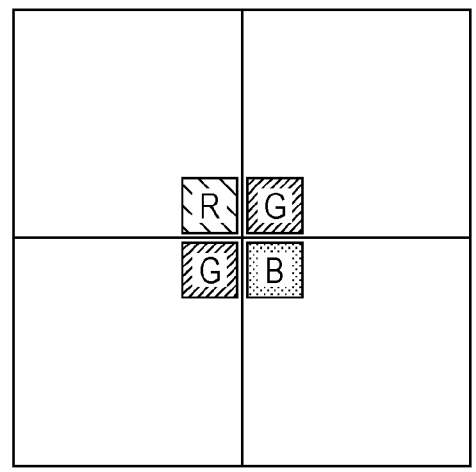
Figure 32:
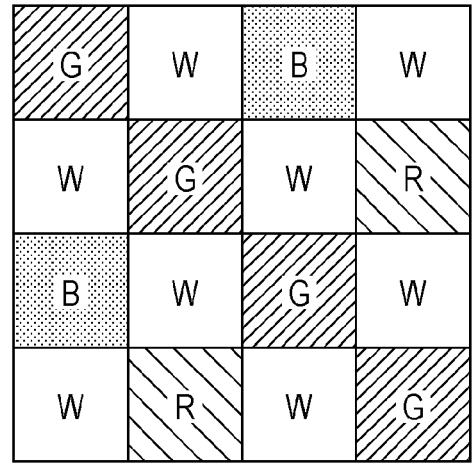
FIG. 32 is an example of color arrangement of a color filter including white.

FIG. 28 is a diagram illustrating a connection relationship according to the third modification example. A basic configuration of FIG. 28 is the same as that of FIG. 2, and the connection relationship of the switch circuit SWa is changed and shown.

The switch circuit SWa includes switches SWa11, SWa1$m$, Swam1, and SWamm. The comparator 721 and the counter 731 are connected through the switch SWa11, and the comparator 72$m$ and the counter 73$m$ are connected through the switch SWamm. The comparator 721 and the counter 73$m$ are connected through the switch SWa1$m$, and the comparator 72$m$ and the counter 731 are connected through the switch SWam1.

That is, the switch circuit SWa includes a switch connecting a comparator and a counter provided corresponding one vertical signal line, and a switch connecting a comparator provided corresponding to one vertical signal line and a counter provided corresponding to the other vertical signal line different from the one vertical signal line.

For this reason, in one set of vertical signal lines VSL1 and VSLm, any one of the counter provided corresponding to one vertical signal line, and the counter provided corresponding to the other vertical signal line is selected to perform the counting. The set of vertical signal lines VSL1 and VSLm may be adjacent or may not be adjacent.

Accordingly, the pixel values of the pixel connected to the vertical signal line VSL1 and the pixel connected to the vertical signal line VSLm can be added and output by the counter 731 and the counter 73m.

Herein, the cross-connection type column processing unit 70 has been described as an example, but it is obvious that the third modification example can be applied to the shift-connection type column processing unit 70.

(5-4) Fourth Modification Example

In the embodiments and modification examples described above, one vertical signal line is provided in two pixel columns, but of course, one vertical signal line may be provided in one pixel column, and one vertical signal line may be provided in three or more pixel columns, The present technology is not limited to the embodiment and modification examples described above, and includes a configuration in which the configurations disclosed in the embodiment and modification examples described above are substituted or the combinations thereof are modified, and a configuration in which the configurations disclosed in the related art and the embodiment and modification examples described above are substituted or the combinations thereof are modified. The technical scope of the present technology is not limited to the embodiments described above, and includes the items described in Claims and equivalents thereof.

The present technology may have the following configuration.

(1) A solid state imaging device including: a pixel array unit that has a plurality of pixels 2-dimensionally arranged in a matrix and a plurality of signal lines arranged along a column direction; A/D conversion units that are provided corresponding to the respective signal lines and convert an analog signal output from a pixel through the signal line into a digital signal; and a switching unit that switches or converts the analog signal output through each signal line into a digital signal using any of an A/D conversion unit provided corresponding to the signal line through which the analog signal is transmitted, and an A/D conversion unit provided corresponding to a signal line other than the signal line through which the analog signal is transmitted.

(2) The solid state imaging device according to (1), wherein the A/D conversion unit has a comparator that compares a time-variable reference signal with an analog signal obtained from the pixel, and a counter that counts a time until the comparison is completed in the comparator, and wherein the switching unit includes a first switch that connects an output terminal of the comparator in the A/D conversion unit provided corresponding to each signal line to an input terminal of the counter, a second switch that connects an output terminal of the comparator in the A/D conversion unit provided corresponding to each signal line to an input terminal of the counter of the A/D conversion unit provided corresponding to the other signal line, and a switching control unit that controls switching of the first switch and the second switch.

(3) The solid state imaging device according to (1) or (2), wherein the switching unit switches or converts the analog signal output from one of two signal lines into a digital signal using any of the A/D conversion unit provided corresponding to one signal line and the A/D conversion unit provided corresponding to the other signal line.

(4) The solid state imaging device according to any one of (1) to (3), wherein the switching unit switches or converts the analog signal output through each signal line of the plurality of signal lines into a digital signal using any of the A/D conversion unit provided corresponding to the signal line through which the analog signal is transmitted, and the A/D conversion unit provided corresponding to the signal line provided to be adjacent to one side of the signal line through which the analog signal is transmitted.

(5) The solid state imaging device according to any one of (1) to (4), wherein a predetermined number of pixels of the plurality of pixels share a floating diffusion, and wherein the switching unit performs analog addition of analog signals of two or more pixels sharing the same floating diffusion by the floating diffusion and outputs the analog-added signals to the signal lines.

(6) The solid state imaging device according to any one of (1) to (5), wherein the plurality of pixels is provided with a color filter array in which colors of filters are classified corresponding to the respective pixels, on a light reception face side, and wherein white filters of the color filter array are disposed in a checkerboard shape, red and blue filters are arranged in a checkerboard shape at a pitch of two pixels vertically and horizontally, the red and blue filters are arranged to obliquely deviate by one pixel, and the remaining pixels are green filters.

(7) The solid state imaging device according to any one of (1) to (6), wherein the plurality of pixels are provided with a color filter array in which colors of filters are classified corresponding to the respective pixels, on the light reception face side, and wherein in the color filter array, the color filters are arranged in a Bayer arrangement.

(8) A method of controlling a solid state imaging device including a pixel array unit that has a plurality of pixels 2-dimensionally arranged in a matrix and a plurality of signal lines arranged along a column direction, and A/D conversion units that are provided corresponding to the signal lines and convert an analog signal output from a pixel through the signal line into a digital signal, the method including: switching conversion of the analog signal output through each signal line into a digital signal using any of an A/D conversion unit provided corresponding to the signal line through which the analog signal is transmitted, and an A/D conversion unit provided corresponding to a signal line other than the signal line through which the analog signal is transmitted.

(9) A program for controlling a solid state imaging device including a pixel array unit that has a plurality of pixels 2-dimensionally arranged in a matrix and a plurality of signal lines arranged along a column direction, and A/D conversion units that are provided corresponding to the signal lines and convert an analog signal output from a pixel through the signal line into a digital signal, the program including: a switching function of switching conversion of the analog signal output through each signal line into a digital signal using any of an A/D conversion unit provided corresponding to the signal line through which the analog signal is transmitted, and an A/D conversion unit provided corresponding to a signal line other than the signal line through which the analog signal is transmitted.

The present disclosure contains subject matter related to that disclosed in Japanese Priority Patent Application JP 2011-207368 filed in the Japan Patent Office on Sep. 22, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid state imaging device comprising:
a pixel array unit that has a plurality of pixels 2-dimensionally arranged in a matrix and a plurality of signal lines arranged along a column direction;
A/D conversion units that are provided corresponding to the respective signal lines and are configured to convert an analog signal output from a pixel through the signal line into a digital signal; and
a switching unit configured to switch the analog signal output through each signal line into a digital signal using any of an A/D conversion unit provided corresponding to the signal line through which the analog signal is transmitted, and an A/D conversion unit provided corresponding to a signal line other than the signal line through which the analog signal is transmitted, wherein the A/D conversion unit has a comparator that is configured to compares a time-variable reference signal with an analog signal obtained from the pixel, and a counter that counts a time until the comparison is completed in the comparator, and
wherein the switching unit includes a first switch that is configured to connect an output terminal of the comparator in the A/D conversion unit provided corresponding to each signal line to an input terminal of the counter, a second switch that is configured to connects the output terminal of the comparator in the A/D conversion unit provided corresponding to each signal line to an input terminal of the counter of the A/D conversion unit provided corresponding to the other signal line, and a switching control unit that controls switching of the first switch and the second switch.

2. The solid state imaging device according to claim 1, wherein the switching unit is configured to switch the analog signal output from one of two signal lines into a digital signal using any of the A/D conversion unit provided corresponding to one signal line and the A/D conversion unit provided corresponding to the other signal line.

3. The solid state imaging device according to claim 1, wherein the switching unit is configured to switch the analog signal output through each signal line of the plurality of signal lines into a digital signal using any of the A/D conversion unit provided corresponding to the signal line through which the analog signal is transmitted, and the A/D conversion unit provided corresponding to the signal line provided to be adjacent to one side of the signal line through which the analog signal is transmitted.

4. The solid state imaging device according to claim 1, wherein a predetermined number of pixels of the plurality of pixels share a floating diffusion, and
wherein the switching unit is configured to perform analog addition of analog signals of two or more pixels sharing the same floating diffusion by the floating diffusion and outputs the analog-added signals to the signal lines.

5. The solid state imaging device according to claim 1, wherein the plurality of pixels is provided with a color filter array in which colors of filters are classified corresponding to the respective pixels, on a light reception face side, and
wherein white filters of the color filter array are disposed in a checkerboard shape, red and blue filters are arranged in a checkerboard shape at a pitch of two pixels vertically and horizontally, the red and blue filters are arranged to obliquely deviate by one pixel, and the remaining pixels are green filters.

6. The solid state imaging device according to claim 1, wherein the plurality of pixels are provided with a color filter array in which colors of filters are classified corresponding to the respective pixels, on the light reception face side, and wherein in the color filter array, the color filters are arranged in a Bayer arrangement.

7. A method of controlling a solid state imaging device including a pixel array unit that has a plurality of pixels 2-dimensionally arranged in a matrix and a plurality of signal lines arranged along a column direction, and A/D conversion units that are provided corresponding to the signal lines and convert an analog signal output from a pixel through the signal line into a digital signal, the method comprising:

switching conversion of the analog signal output through each signal line into a digital signal using any of an A/D conversion unit provided corresponding to the signal line through which the analog signal is transmitted, and an A/D conversion unit provided corresponding to a signal line other than the signal line through which the analog signal is transmitted, wherein the A/D conversion unit has a comparator that compares a time-variable reference signal with an analog obtained from the pixel, and a counter that counts a time comparison is completed in the comparator, and wherein the switching conversion includes connecting the output terminal of the comparator in the A/D conversion unit provided corresponding to each signal line to an input terminal of the counter through a first switch, and connecting the output terminal of the comparator in the A/D conversion unit provided corresponding to each signal line to an input terminal of the counter of the A/D conversion unit provided corresponding to the other signal line through a second switch, and controlling switching of the first switch and the second switch through a switching control unit.

8. A non-transitory computer readable medium, having stored thereon, a set of computer-executable instructions for causing a computer to perform a method of controlling a solid state imaging device including a pixel array unit that has a plurality of pixels 2-dimensionally arranged in a matrix and a plurality of signal lines arranged along a column direction, and A/D conversion units that are provided corresponding to the signal lines and convert an analog signal output from a pixel through the signal line into a digital signal, the method comprising:

a switching function of switching conversion of the analog signal output through each signal line into a digital signal using any of an A/D conversion unit provided corresponding to the signal line through which the analog signal is transmitted, and an A/D conversion unit provided corresponding to a signal line other than the signal line through which the analog signal is transmitted, wherein the A/D conversion unit has a computer that compares a time-variable reference signal with an analog signal obtained from the pixel, and a counter that counts a time until the comparison is completed in the comparator, and wherein the switching function includes connecting an output terminal of the comparator in the A/D conversion unit provided corresponding to each signal to an input terminal of the counter through a first switch, and connecting the output terminal of the comparator in the A/D conversion unit provided corresponding to each signal line to an input terminal of the counter of the A/D conversion unit provided corresponding to the other signal line through a second switch, and controlling switching of the first switch and the second switch through a switching control unit.

* * * * *